United States Patent
Onodera et al.

(10) Patent No.: US 12,261,595 B2
(45) Date of Patent: Mar. 25, 2025

(54) SEMICONDUCTOR DEVICE

(71) Applicant: ROHM CO., LTD., Kyoto (JP)

(72) Inventors: Kenichi Onodera, Kyoto (JP); Masashi Hayashiguchi, Kyoto (JP)

(73) Assignee: ROHM CO., LTD., Kyoto (JP)

(*) Notice: Subject to any disclaimer, the term of this patent is extended or adjusted under 35 U.S.C. 154(b) by 67 days.

(21) Appl. No.: 18/469,301

(22) Filed: Sep. 18, 2023

(65) Prior Publication Data
US 2024/0007097 A1 Jan. 4, 2024

Related U.S. Application Data

(63) Continuation of application No. PCT/JP2022/018652, filed on Apr. 25, 2022.

(30) Foreign Application Priority Data

May 10, 2021 (JP) ................................. 2021-079550

(51) Int. Cl.
  *H03K 17/12* (2006.01)
  *H02M 1/08* (2006.01)

(52) U.S. Cl.
  CPC ............ *H03K 17/127* (2013.01); *H02M 1/08* (2013.01); *H03K 17/122* (2013.01)

(58) Field of Classification Search
  None
  See application file for complete search history.

(56) References Cited

U.S. PATENT DOCUMENTS

| 10,050,029 B2 * | 8/2018 | Shirakawa | H10D 62/111 |
| 10,461,739 B2 * | 10/2019 | Basler | H10D 84/403 |
| 10,541,681 B2 * | 1/2020 | Asako | H03K 17/127 |

FOREIGN PATENT DOCUMENTS

| DE | 10 2017 105 712 A1 | 10/2018 |
| JP | 4-354156 | 12/1992 |
| JP | 2015-149508 | 8/2015 |
| JP | 2018-174252 | 11/2018 |

(Continued)

OTHER PUBLICATIONS

International Search Report issued in International Application No. PCT/JP2022/018652, Jul. 26, 2022, 2 pages.

(Continued)

*Primary Examiner* — Jeffrey S Zweizig
(74) *Attorney, Agent, or Firm* — HSML P.C.

(57) ABSTRACT

A semiconductor device includes a switching circuit that switches between conducting state and disconnected state. The switching circuit includes first and second switching elements electrically connected in parallel. The first switching element is an IGBT, and the second switching element is a MOSFET. When a current flowing in the switching circuit is less than a first current value, the second switching element has a lower voltage than the first switching element. When the current flowing in the switching circuit is not less than a second current value and not greater than a third current value, the threshold voltage of the second switching element ranges from −1.0 V to +0.4 V relative to the threshold voltage of the first switching element. The third current value is not greater than the rated current of the switching circuit. The first current value is less than the third current value.

16 Claims, 17 Drawing Sheets

(56) References Cited

FOREIGN PATENT DOCUMENTS

| | | |
|---|---|---|
| JP | 2020-088445 | 6/2020 |
| JP | 2020-108225 | 7/2020 |

OTHER PUBLICATIONS

Written Opinion issued in International Application No. PCT/JP2022/018652, Jul. 26, 2022, 2 pages.

Office Action issued in corresponding German Patent application No. 11 2022 001 871.2, Sep. 9, 2024, and machine translation (12 pages).

\* cited by examiner

US 12,261,595 B2

SEMICONDUCTOR DEVICE

TECHNICAL FIELD

The present disclosure relates to a semiconductor device.

BACKGROUND ART

Semiconductor devices with switching elements such as MOSFETS (Metal Oxide Semiconductor Field Effect Transistor) and IGBTs (Insulated Gate Bipolar Transistor) are conventionally known. For example, JP-A-2018-174252 discloses a power module (semiconductor device) with switching elements such as MOSFETs or IGBTs. Such a power module is used, for example, in an inverter to perform power conversion through the switching operations of the switching elements.

BRIEF DESCRIPTION OF THE DRAWINGS

FIG. 8 shows the simulation results of changes in the drive signal during turn-on.

DETAILED DESCRIPTION OF EMBODIMENTS

Figure 1:
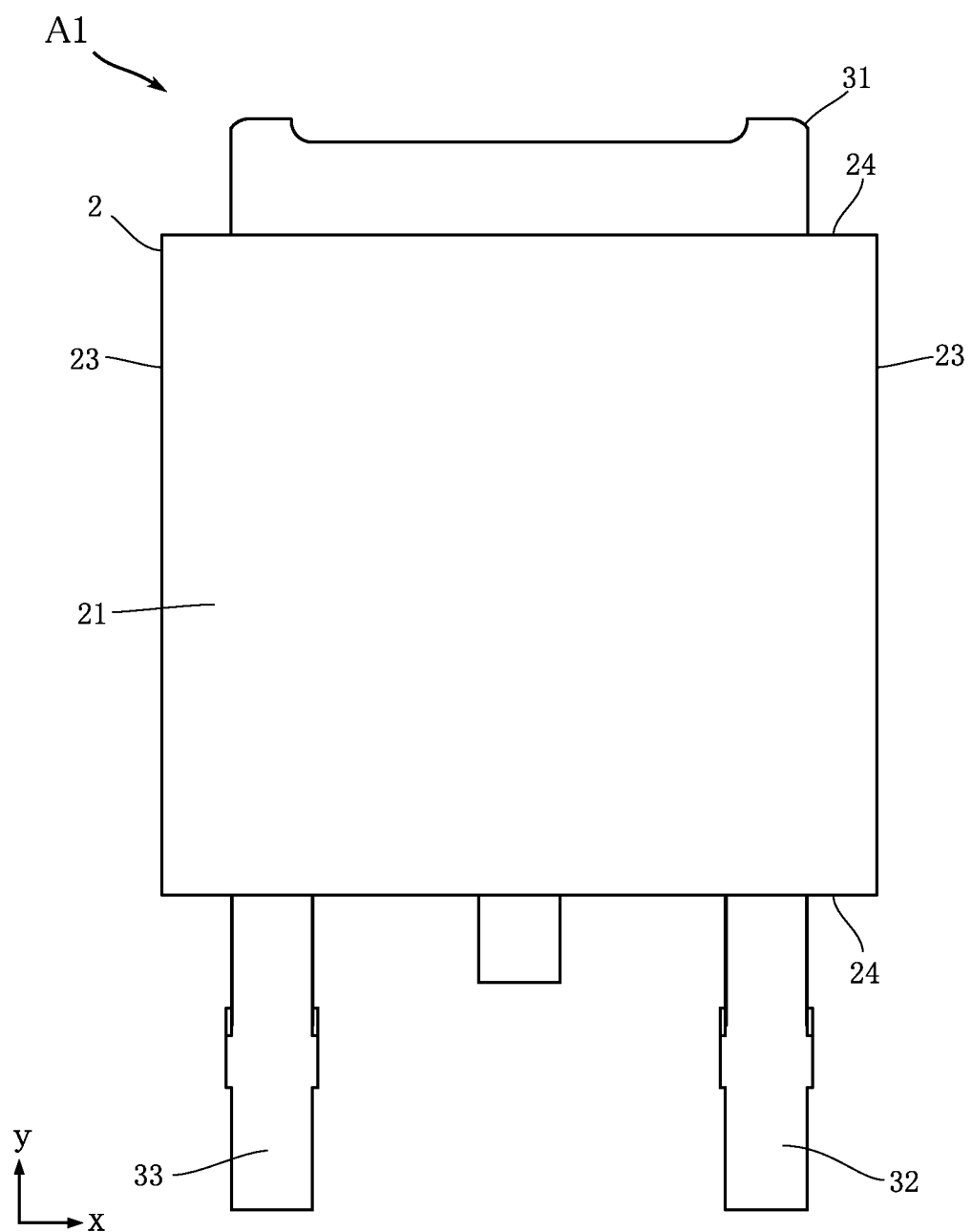
FIG. 1 is a plan view showing a semiconductor device according to a first embodiment.

The following describes preferred embodiments of a semiconductor device according to the present disclosure with reference to the drawings. In the description given below, the elements that are identical or similar to each other are denoted by the same reference signs, and the description thereof are omitted. In the present disclosure, the terms such as "first", "second", and "third" are used merely as labels and are not intended to impose ordinal requirements on the items to which these terms refer.

In the present disclosure, the phrases "an object A is formed in an object B" and "an object A is formed on an object B" include, unless otherwise specified, "an object A is formed directly in/on the object B" and "an object A is formed in/on the object B with another object interposed between the object A and the object B". Similarly, the phrases "an object A is disposed in an object B" and "an object A is disposed on an object B" include, unless otherwise specified, "an object A is disposed directly in/on the object B" and "an object A is disposed in/on the object B with another object interposed between the object A and the object B". Similarly, the phrase "an object A is located on an object B" includes, unless otherwise specified, "an object A is located on an object B in contact with the object B" and "an object A is located an object B with another object interposed between the object A and the object B". Also, the phrase "an object A overlaps with an object B as viewed in a certain direction" includes, unless otherwise specified, "an object A overlaps with the entirety of an object B" and "an object A overlaps with a portion of an object B".

FIGS. 1 to 5 show a semiconductor device A1 according to a first embodiment. The semiconductor device A1 includes a switching circuit 1, a resin member 2, a plurality of leads 3 and a plurality of connecting members 4. The switching circuit 1 includes a first switching element 11 and a second switching element 12. The plurality of leads 3 include a first lead 31, a second lead 32 and a third lead 33. The plurality of connecting members 4 include a plurality of first connecting members 411 and 412 and a pair of second connecting members 421 and 422.

The semiconductor device A1 has a package structure for surface-mounting in the example shown in FIGS. 1 to 4, but may have a package structure for lead insertion. The semiconductor device A1 is of a TO (Transistor Outline) package type, but other package types such as the SOP (Small Outline Package) and the leadless package may be employed.

For the convenience of description, the thickness direction of each of the first switching element 11 and the second switching element 12 is defined as "the thickness direction z". In the description given below, "plan view" refers to the view as seen in the thickness direction z. A direction orthogonal to the thickness direction z is referred to as "the first direction x". The first direction x may be the horizontal direction in a plan view (see FIGS. 1 and 2) of the semiconductor device A1. The direction orthogonal to the thickness direction z and the first direction x is referred to as "the second direction y". For example, the second direction y is the vertical direction in a plan view (see FIGS. 1 and 2) of the semiconductor device A1.

Figure 5:
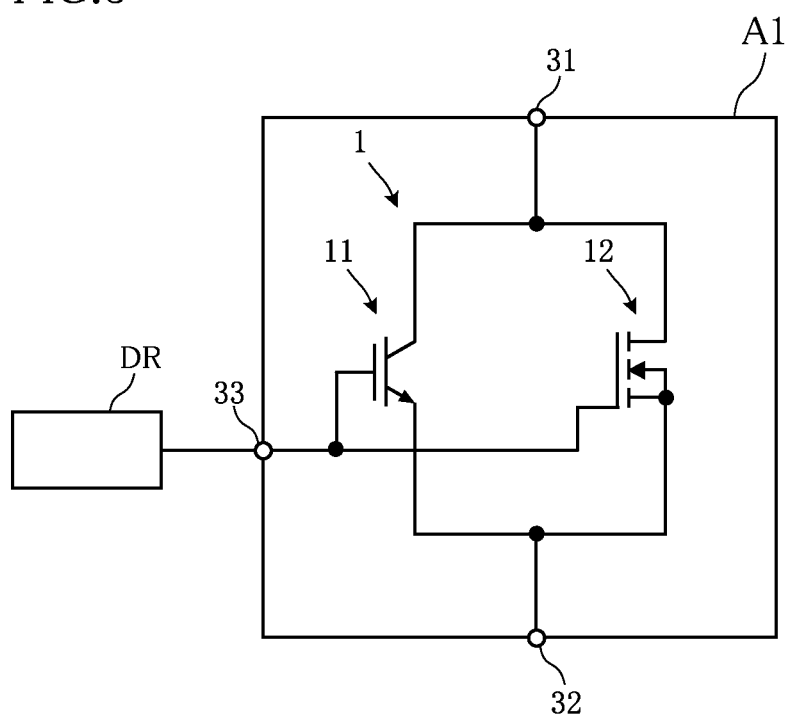
FIG. 5 is a view showing an example of the circuit configuration of the semiconductor device according to the first embodiment.

The switching circuit 1 is the element that performs the electrical function of the semiconductor device A1. As shown in FIG. 5, the switching circuit 1 is controlled by a drive circuit DR installed outside the semiconductor device A1 and switches between a conducting state and a disconnected state. In the present disclosure, the transition period of switching from the conducting state to the disconnected state is called turn-off, and the transition period of switching from the disconnected state to the conducting state is called turn-on. The conducting state after turn-on and before turn-off is called a steady state. The semiconductor device A1 is used within a range in which the working current does not exceed the rated current of the switching circuit 1. The working current is the current that flows in the switching circuit 1 when the switching circuit 1 is in the steady state.

The rated current defines the use conditions of the semiconductor device A1 and is the maximum current (allowable current) at which the semiconductor device A1 (the switching circuit 1) can be used safely. When the working current exceeds the rated current, the semiconductor device A1 (the switching circuit 1) may fail or be destroyed.

As described above, the switching circuit 1 includes a first switching element 11 and a second switching element 12.

The first switching element 11 is, for example, an IGBT. The first switching element 11 includes a first semiconductor material. The first semiconductor material is Si (silicon), for example. The first semiconductor material may be SiC (silicon carbide), GaAs (gallium arsenide), GaN (gallium nitride) or $Ga_2O_3$ (gallium oxide), rather than Si. The first switching element 11 is rectangular in plan view.

Figure 4:
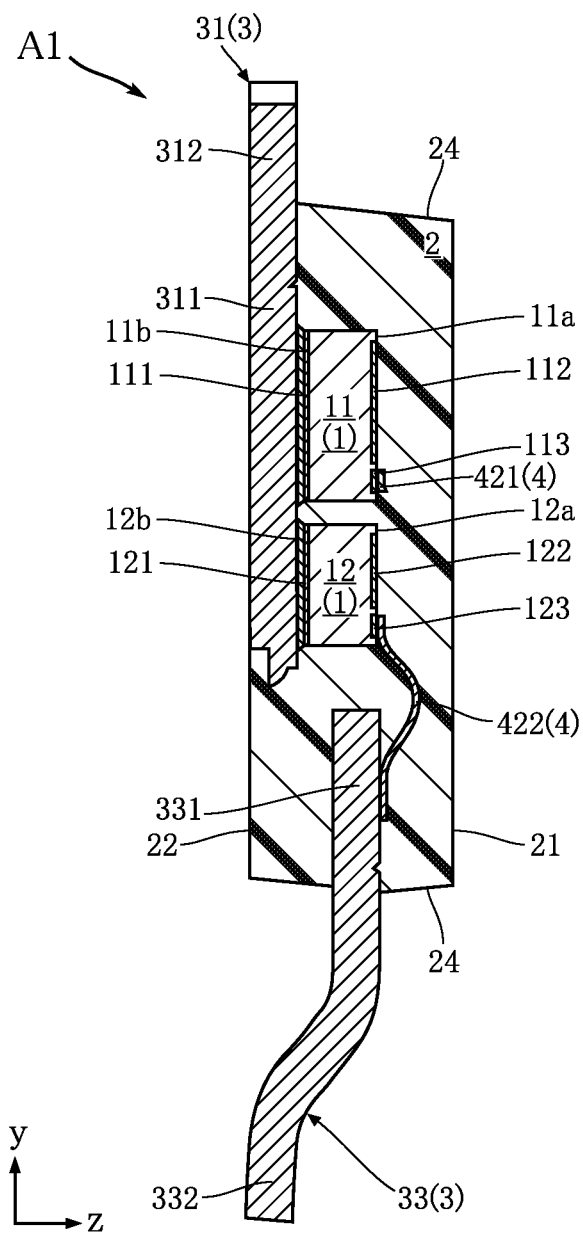
FIG. 4 is a sectional view taken along line IV-IV in FIG. 2.

As shown in FIG. 4, the first switching element 11 has a first element obverse surface 11a and a first element reverse surface 11b. The first element obverse surface 11a and the first element reverse surface 11b are spaced apart from each other in the thickness direction z. The first element obverse surface 11a faces one side (upward) in the thickness direction z, and the first element reverse surface 11b faces the other side (downward) in the thickness direction z.

Figure 2:
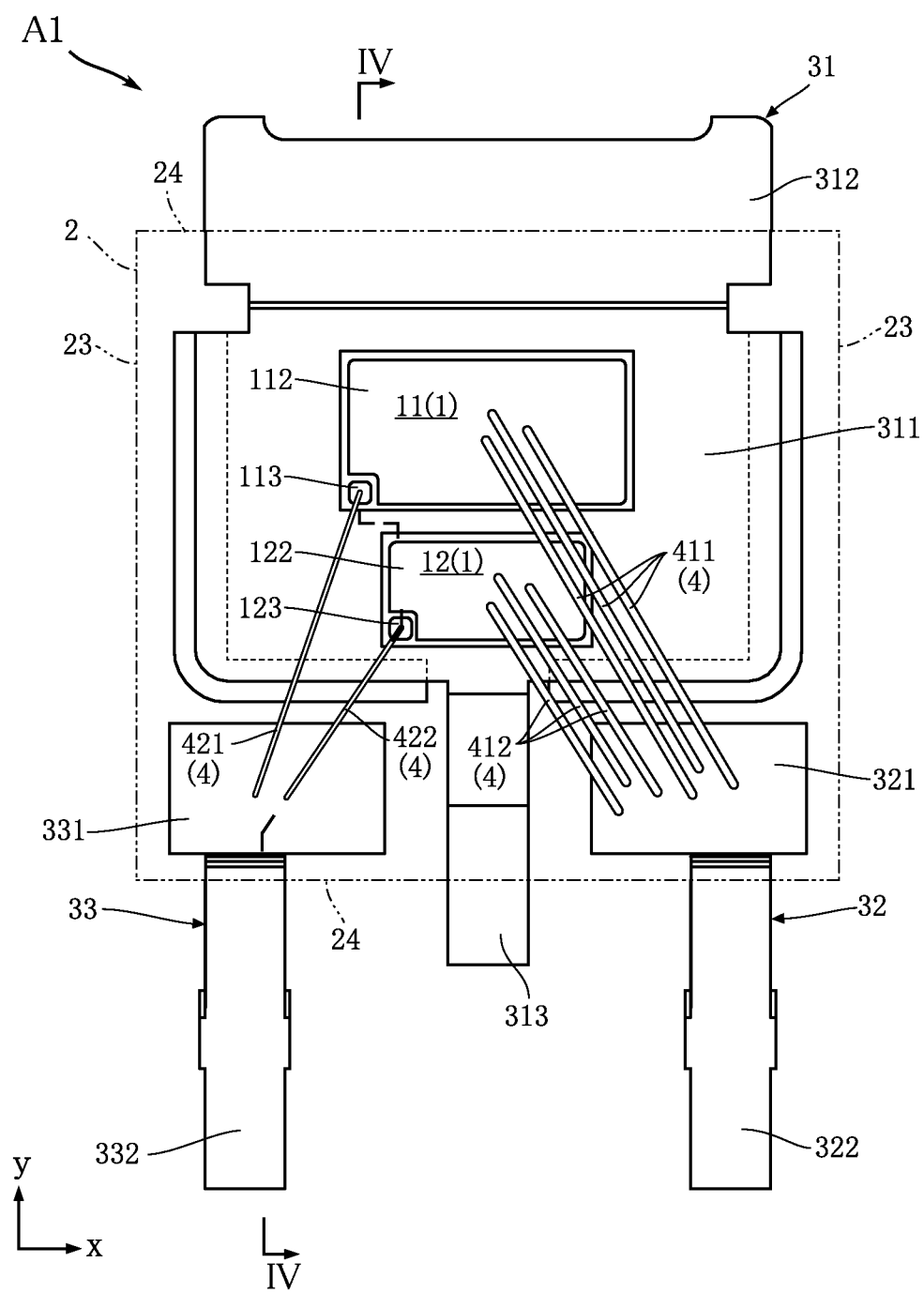
FIG. 2 is a plan view corresponding to FIG. 1, in which a resin member is indicated by imaginary lines.
Figure 3:
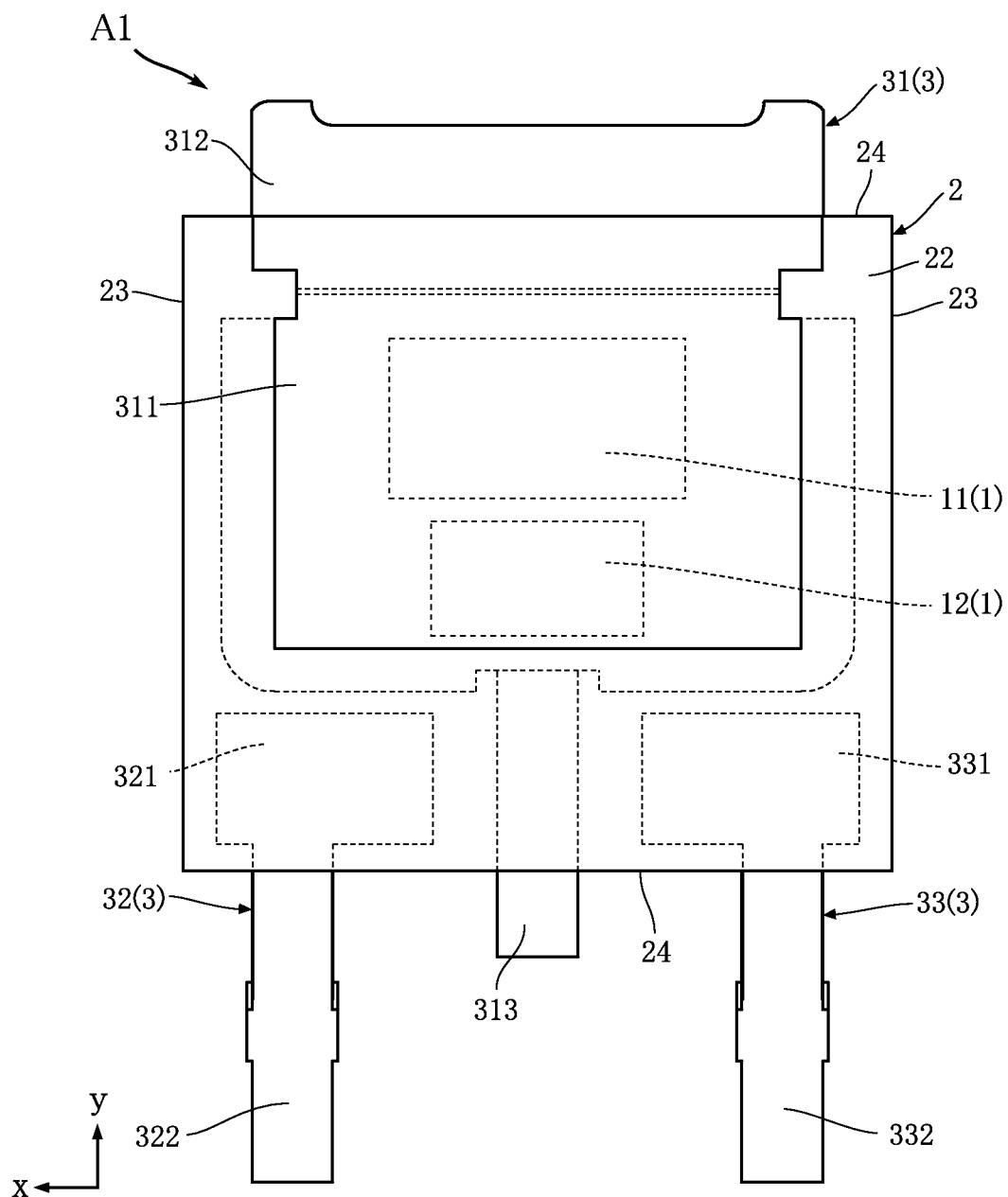
FIG. 3 is a bottom view showing the semiconductor device according to the first embodiment.

The first switching element 11 has a first electrode 111, a second electrode 112 and a third electrode 113. The first electrode 111 is a collector. The second electrode 112 is an emitter. The third electrode 113 is a gate. The first electrode 111 is disposed on the first element reverse surface 11b, and the second electrode 112 and the third electrode 113 are disposed on the first element obverse surface 11a. As shown in FIG. 2, the second electrode 112 and the third electrode 113 are spaced apart from each other.

In the first switching element 11, a drive signal (gate voltage) is input to the third electrode 113. The first switching element 11 switches between the conducting state and the disconnected state in response to the inputted drive signal. This operation of switching between the conducting state and the disconnected state is called switching operation. In the conducting state, current flows from the first electrode 111 (collector) to the second electrode 112 (emitter). In the disconnected state, this current does not flow. That is, in the first switching element 11, ON/OFF control between the first electrode 111 and the second electrodes 112 is performed by the drive signal inputted to the third electrode 113. Hereinafter, the voltage applied between the first electrode 111 and the second electrode 112 is simply referred to as "the voltage of the first switching element 11" or the like.

The second switching element 12 is a MOSFET, for example. The second switching element 12 includes a second semiconductor material. The second semiconductor material has a wider bandgap than the first semiconductor material and is SiC, for example. The second semiconductor material may be Si, GaAs, GaN or $Ga_2O_3$, rather than SiC. The second switching element 12 is rectangular in plan view. In the example shown in FIG. 2, the area in plan view of the second switching element 12 is smaller than that of the first switching element 11. Note that such relationship as to the area in plan view is not limited to the example shown in FIG. 2.

As shown in FIG. 4, the second switching element 12 has a second element obverse surface 12a and a second element reverse surface 12b. The second element obverse surface 12a and the second element reverse surface 12b are spaced apart from each other in the thickness direction z. The second element obverse surface 12a faces one side (upward) in the thickness direction z, and the second element reverse surface 12b faces the other side (downward) in the thickness direction z. The second element obverse surface 12a faces in the same direction as the first element obverse surface 11a, and the second element reverse surface 12b faces in the same direction as the first element reverse surface 11b.

The second switching element 12 has a fourth electrode 121, a fifth electrode 122 and a sixth electrode 123. The fourth electrode 121 is a drain. The fifth electrode 122 is a source. The sixth electrode 123 is a gate. The fourth electrode 121 is disposed on the second element reverse surface 12b, and the fifth electrode 122 and the sixth electrode 123 are disposed on the second element obverse surface 12a. As shown in FIG. 2, the fifth electrode 122 and the sixth electrode 123 are spaced apart from each other.

In the second switching element 12, a drive signal (gate voltage) is input to the sixth electrode 123. The drive signal inputted to the sixth electrode 123 is common to the drive signal inputted to the third electrode 113. The second switching element 12 switches (i.e., performs switching operation) between the conducting state and the disconnected state in response to the inputted drive signal. In the conducting state, current flows from the fourth electrode 121 (drain) to the fifth electrode 122 (source). In the disconnected state, this current does not flow. That is, in the second switching element 12, ON/OFF control between the fourth electrode 121 and the fifth electrode 122 is performed by the drive signal inputted to the sixth electrode 123. Hereinafter, the voltage applied between the fourth electrode 121 and the fifth electrode 122 is simply referred to as "the voltage of the second switching element 12" or the like.

In the switching circuit 1, with the configuration described below, the first electrode 111 (collector) and the fourth electrode 121 (drain) are electrically connected to each other, and the second electrode 112 (emitter) and the fifth electrode 122 (source) are electrically connected to each other. Thus, as shown in FIG. 5, the first switching element 11 and the second switching element 12 are electrically connected in parallel. The switching circuit 1 is in the conducting state when at least one of the first switching element 11 and the second switching element 12 is in the conducting state. The switching circuit 1 is in the disconnected state when both of the first switching element 11 and the second switching element 12 are in the disconnected state. When both of the first switching element 11 and the second switching element 12 are in the conducting state, the current flowing in the switching circuit 1 is distributed between the first switching element 11 and the second switching element 12.

The first switching element 11 and the second switching element 12 have different electrical characteristics from each other. In the semiconductor device A1, two elements having the following electrical characteristics are used. That is, when the current flowing in the switching circuit 1 (more precisely, the current flowing in each switching element) is less than a first current value, the voltage of the second switching element 12 is lower than the voltage of the first switching element 11, and the second switching element 12 has a lower resistance than the first switching element 11. When the current flowing in the switching circuit 1 is equal to or greater than a second current value and equal to or less than a third current value, the threshold voltage of the second switching element 12 is in the range from −1.0 V to +0.4 V, inclusive, relative to the threshold voltage of the first switching element 11. Hereinafter, this range is referred to as "the threshold set range". When the current flowing in the switching circuit 1 is equal to or greater than the second current value and equal to or less than the third current value, the threshold voltage of the first switching element 11 is, for example, from 7 V to 7.5 V inclusive, and the threshold voltage of the second switching element 12 is, for example, from 6 V to 7.9 V, inclusive (i.e., in the range from −1.0 V to +0.4 V, inclusive, relative to the threshold voltage of the first switching element 11). Each of the first current value, the second current value and the third current value is smaller than the rated current of the switching circuit 1. The first current value is smaller than the third current value. In the semiconductor device A1, the first current value is, for example, ⅕ of the rated current of the switching circuit 1. The second current value may be equal to the first current value and is, for example, ⅕ of the rated current of the switching circuit 1. The third current value is, for example, ⅗ of the rated current of the switching circuit 1. That is, in the semiconductor device A1, the electrical characteristics of the first switching element 11 and the second switching element 12 are set to satisfy the following two conditions. As the first condition, in the current range in which the current flowing in the switching circuit 1 is less than ⅕ of the rated current of the semiconductor device A1 (switching circuit 1), the voltage of the second switching element 12 is greater than the voltage of the first switching element 11. As the second condition, in the current range in which the current flowing in the switching circuit 1 is from ⅕ to ⅗, inclusive, of the rated current of the semiconductor device A1, the threshold voltage of the second switching element 12 is in the above-mentioned threshold set range (the range from −1.0 V to +0.4 V, inclusive) relative to the threshold voltage of the first switching element 11. The first current value and the second current are equal to each other in the example described above, but these values may not be equal to each other. In the semiconductor device A1, the working current is set to be equal to or greater than the first current value.

The resin member 2 is a sealing member for protecting the switching circuit 1. The resin member 2 covers the switching circuit 1, a part of each of the leads 3, and the connecting members 4. The resin member 2 is made of an insulating resin material, for example. The insulating resin material is epoxy resin, for example. The resin member 2 has a resin obverse surface 21, a resin reverse surface 22, a pair of first resin side surfaces 23 and a pair of second resin side surfaces 24.

As shown in FIG. 4, the resin obverse surface 21 and the resin reverse surface 22 are spaced apart from each other in the thickness direction z. The resin obverse surface 21 faces one side (upward) in the thickness direction z, and the resin reverse surface 22 faces the other side (downward) in the thickness direction z. The pair of first resin side surfaces 23 and the pair of second resin side surfaces 24 are sandwiched between and connected to the resin obverse surface 21 and the resin reverse surface 22 in the thickness direction z. As shown in FIG. 1, the first resin side surfaces 23 are spaced apart from each other in the first direction x. The first resin side surfaces 23 face away from each other in the first direction x. The second lead 32 and the third lead 33 partially project from one of the pair of second resin side surfaces 24 (e.g., the second resin side surface 24 on the lower side in FIG. 1). As shown in FIG. 1, the second resin side surfaces 24 are spaced apart from each other in the second direction y. The second resin side surfaces 24 face away from each other in the second direction y.

The leads 3 support the first switching element 11 and the second switching element 12 and electrically conduct to the first switching element 11 and the second switching element 12. The constituent material of the leads 3 include copper (Cu), for example. Instead of Cu, aluminum, iron (Fe), iron (Fe), oxygen-free copper, or alloys of these (e.g., a Cu—Sn alloy, a Cu—Zr alloy, or a Cu—Fe alloy) may be used as the constituent material of the leads 3. Each of the leads 3 may be plated with nickel (Ni). As described above, the plurality of leads 3 include the first lead 31, the second lead 32 and the third lead 33. The first lead 31, the second lead 32 and the third lead 33 are spaced apart from each other. The first lead 31, the second lead 32 and the third lead 33 are formed by appropriately cutting a metal lead frame patterned by etching and punching, for example.

The first lead 31 electrically conducts to the first electrode 111 (collector) of the first switching element 11 and the fourth electrode 121 (drain) of the second switching element 12. The first lead 31 includes a die pad 311, an extension 312 and a protruding portion 313.

The first switching element 11 and the second switching element 12 are bonded to the die pad 311. The die pad 311 faces the first element reverse surface 11b of the first switching element 11 and the second element reverse surface 12b of the second switching element 12. The first electrode 111 (collector) and the fourth electrode 121 (drain) are bonded to the die pad 311, and the die pad 311 electrically conducts to these. The first electrode 111 and the fourth electrode 121 are electrically connected to each other via the die pad 311. The die pad 311 is a flat plate portion. As shown in FIG. 4, the die pad 311 is exposed from the resin member 2 at the surface facing away from the surface on which the first switching element 11 and the second switching element 12 are mounted, in the thickness direction z (i.e., the surface facing downward in the thickness direction z). The die pad 311 is the input end of the switching circuit 1 and the current input terminal of the semiconductor device A1.

The extension 312 and the protruding portion 313 are connected to the die pad 311. The extension 312 and the protruding portion 313 are located on opposite sides of the die pad 311 in the second direction y. The extension 312 protrudes from the resin member 2 to one side in the second direction y, and the protruding portion 313 protrudes from the resin member 2 to the other side in the second direction y. The protruding portion 313 is located between the second lead 32 and the third lead 33 in the first direction x.

The second lead 32 electrically conducts to the second electrode 112 (emitter) of the first switching element 11 and the fifth electrode 122 (source) of the second switching element 12. The second lead 32 includes a pad portion 321 and a terminal portion 322.

As shown in FIG. 2, the first connecting members 411 are bonded to the pad portion 321, and the pad portion 321 electrically conducts to the second electrode 112 (emitter) of the first switching element 11 via the first connecting members 411. As shown in FIG. 2, the first connecting members 412 are also bonded to the pad portion 321, and the pad portion 321 electrically conducts to the fifth electrode 122 (source) of the second switching element 12 via the first connecting members 412. The second electrode 112 and the fifth electrode 122 are electrically connected to each other via the first connecting members 411 and 412 and the second lead 32.

As shown in FIG. 2, the terminal portion 322 is connected to the pad portion 321. The terminal portion 322 electrically conducts to the pad portion 321 and is exposed from the resin member 2. The terminal portion 322 protrudes from the resin member 2 to one side in the second direction y. Specifically, in the second direction y, the protruding sense of the terminal portion 322 is the same as the sense in which the protruding portion 313 is offset from the die pad 311. The terminal portion 322 is the output end of the switching circuit 1 and the current output terminal of the semiconductor device A1.

The third lead 33 electrically conducts to the third electrode 113 (gate) of the first switching element 11 and the sixth electrode 123 (gate) of the second switching element 12. The third lead 33 includes a pad portion 331 and a terminal portion 332.

As shown in FIG. 2, the second connecting member 421 is bonded to the pad portion 331, and the pad portion 331 electrically conducts to the third electrode 113 (gate) of the first switching element 11 via the second connecting member 421. As shown in FIG. 2, the second connecting member 422 is also bonded to the pad portion 331, and the pad portion 331 electrically conducts to the sixth electrode 123 (gate) of the second switching element 12 via the second connecting member 422.

As shown in FIG. 2, the terminal portion 332 is connected to the pad portion 331. The terminal portion 332 electrically conducts to the pad portion 331 and exposed from the resin member 2. The terminal portion 332 protrudes from the resin member 2 to one side in the second direction y. Specifically, in the second direction y, the protruding sense of the terminal portion 332 is the same as the sense in which the protruding portion 313 is offset from the die pad 311. The terminal portion 332 is the input terminal for drive signals of the semiconductor device A1. The terminal portion 332 is connected to the drive circuit DR external to the semiconductor device A1. Drive signals are input from the drive circuit Dr to the semiconductor device A1.

The semiconductor device A1 includes the first lead 31 as a first conductor and the second lead 32 as a second conductor for the switching circuit 1.

Each of the connecting members 4 electrically connects two portions that are spaced apart from each other. The connecting members 4 are, for example, bonding wires. The plurality of connecting members 4 include the plurality of first connecting members 411 and 412 and the pair of second connecting members 421 and 422.

As shown in FIG. 2, each of the first connecting members 411 is bonded to the second electrode 112 of the first switching element 11 and the pad portion 321 of the second lead 32. Thus, the second lead 32 electrically conducts to the second electrode 112 (emitter) via the first connecting members 411. As shown in FIG. 2, each of the first connecting members 412 is bonded to the fifth electrode 122 of the second switching element 12 and the pad portion 321 of the second lead 32. Thus, the second lead 32 electrically conducts to the fifth electrode 122 (source) via the first connecting members 412.

As shown in FIG. 2, the second connecting member 421 is bonded to the third electrode 113 of the first switching element 11 and the pad portion 331 of the third lead 33. Thus, the third lead 33 electrically conducts to the third electrode 113 (gate) via the second connecting members 421. As shown in FIG. 2, the second connecting member 422 is bonded to the sixth electrode 123 of the second switching element 12 and the pad portion 331 of the third lead 33. Thus, the third lead 33 electrically conducts to the sixth electrode 123 (gate) via the second connecting member 422.

The effect and advantages of the semiconductor device A1 are described below.

The semiconductor device A1 includes the switching circuit 1. The switching circuit 1 includes the first switching element 11 and the second switching element 12. The first switching element 11 is an IGBT, and the second switching element 12 is a MOSFET. MOSFETs and IGBTs are known to generally exhibit the following electrical characteristics because of the differences in physical properties and structure. MOSFETs have faster switching speeds than IGBTs and lower switching loss than IGBTs. Switching loss is the loss that occurs during the switching (turn-on or turn-off) of the switching element. On the other hand, IGBTs have lower on-resistance than MOSFETs and lower steady-state loss than MOSFETs in a large current region. The steady-state loss is the loss that occurs during the steady state (conducting state) of the switching element and caused by the on-resistance of the switching device. In view of these, in the semiconductor device A1, the first switching element 11 and the second switching element 12 are electrically connected in parallel with each other, while the electrical characteristics of the first switching element 11 and the second switching element 12 are set to satisfy the following two conditions. The first condition is that when the current flowing in the switching circuit 1 is less than the first current value, the second switching element 12 has a lower voltage than the first switching element 11. The second condition is that when the current in the switching circuit 1 equal to or greater than a second current value and equal to or less than a third current value, the threshold voltage of the second switching element 12 is in the range from −1.0 V to +0.4 V, inclusive, relative to the threshold voltage of the first switching element 11. With such a configuration, more current flows in the second switching element 12 (MOSFET) during switching (turn-on and turn-off) of the switching circuit 1, thereby reducing switching loss. On the other hand, more current flows in the first switching element 11 (IGBT) when the switching circuit 1 is in the steady state, thereby reducing the steady-state loss. In this way, the semiconductor device A1 can reduce both switching loss and steady-state loss, thereby reducing power loss. Thus, the semiconductor device A1 can improve the conversion efficiency.

In the semiconductor device A1, a common drive signal is input to the first switching element 11 and the second switching element 12. Since an IGBT and a MOSFET have different electrical characteristics as described above, when they are operated in parallel by a common drive signal, oscillations of the drive signal may occur. Such oscillations of the drive signal may occur during, for example, turn-on or turn-off and can be a cause of malfunctions of the IGBT and the MOSFET. In the semiconductor device A1, by setting the electrical characteristics of the first switching element 11 and the second switching element 12 to satisfy the conditions described above, oscillations of the drive signal are suppressed even when a common drive signal is inputted, and malfunctions of the first switching element 11 and the second switching element 12 (and hence of the switching circuit 1) can be suppressed. Such reduction of oscillations of a drive signal was verified by simulation.

Figure 6:
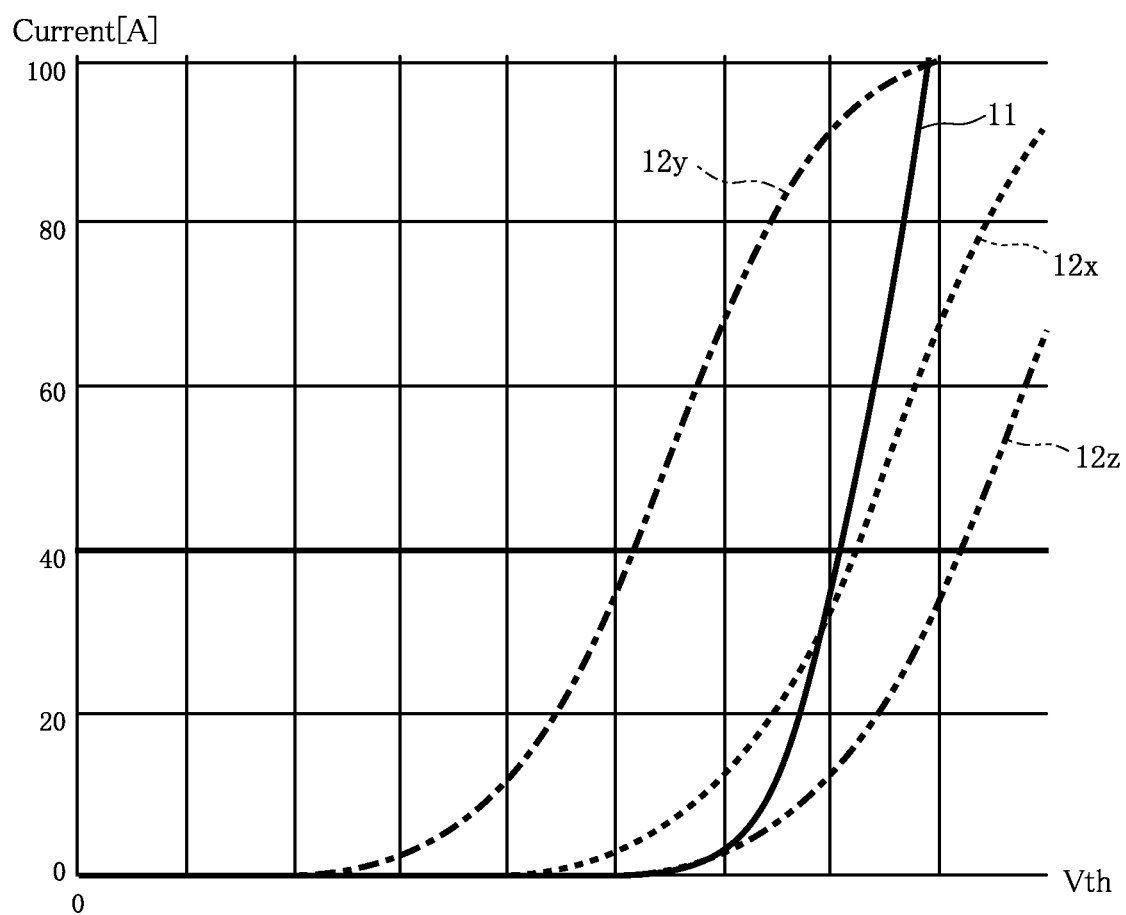
FIG. 6 is a view showing threshold voltage characteristics of second switching elements used in the simulation and a first switching element.

In the simulation, three second switching devices 12 (MOSFETs) with different threshold voltage characteristics were used to examine the time variation of the drive signal during turn-off and turn-on. For the convenience of description, the three second switching elements 12 are referred to as a second switching element 12x, a second switching element 12y and a second switching element 12z, respectively. The threshold voltage characteristics of the three second switching elements 12x, 12y and 12z (MOSFETs) and the first switching element 11 (IGBT) are shown in FIG. 6. In FIG. 6, the horizontal axis represents the threshold voltage, and the vertical axis represents the current flowing in the switching circuit 1. Supposing that the rated current is 100 A, the range of ⅕ to ⅗ (inclusive) of the rated current, an example discussed above with the threshold set range, corresponds to the range from 20 A to 60 A, inclusive, on the vertical axis in FIG. 6. In the simulation, the time variation of the drive voltage when the current flowing in the switching circuit 1 is 40 A was evaluated. Note that when the current is 40 A, the threshold voltage of the second switching element 12x is in the threshold set range, the threshold voltage of the second switching element 12y is below the lower limit of the threshold set range, and the threshold voltage of the second switching element 12z is above the upper limit of the threshold set range.

Figure 7:
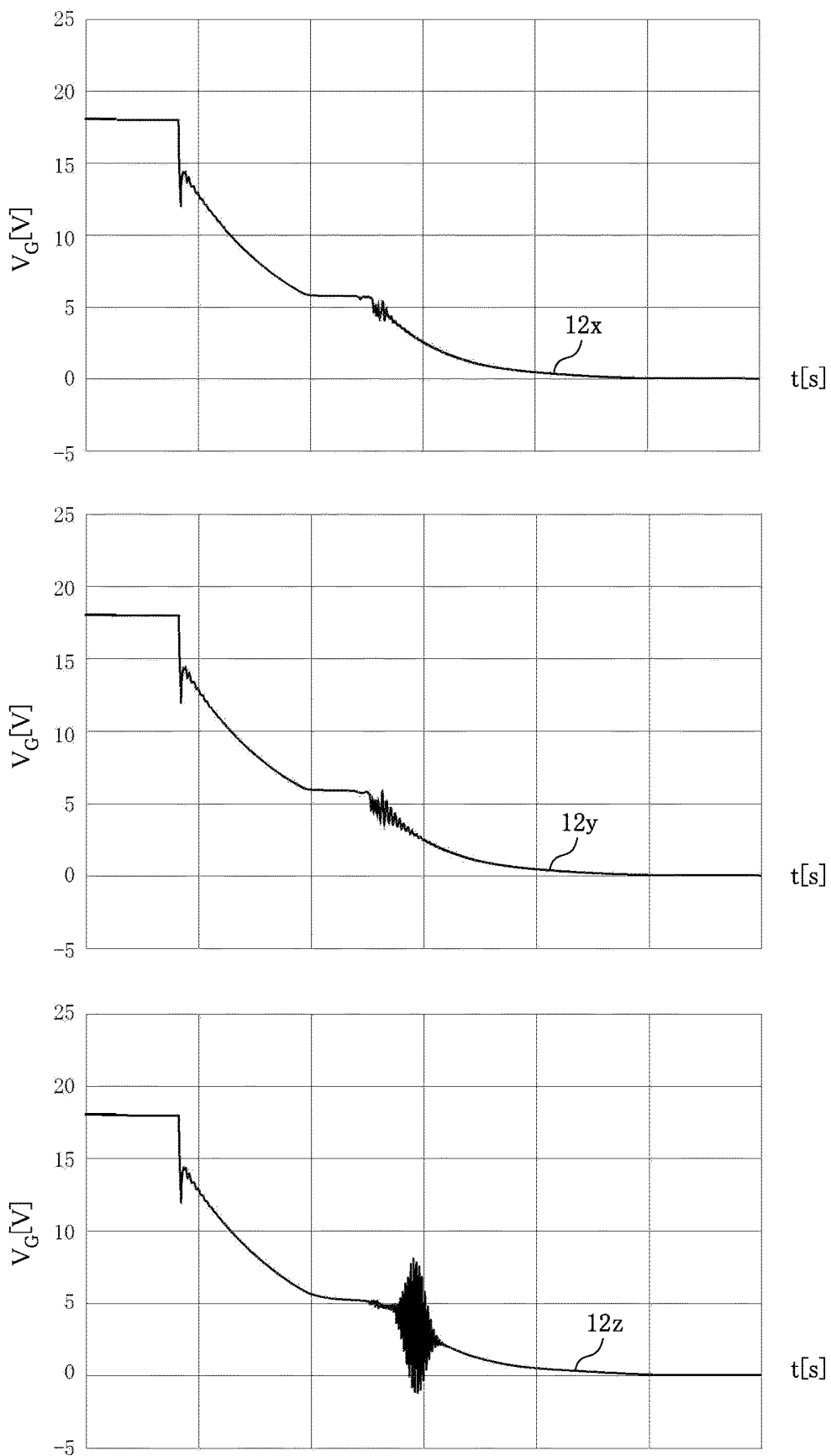
FIG. 7 shows the simulation results of changes in a drive signal during turn-off.
Figure 8:
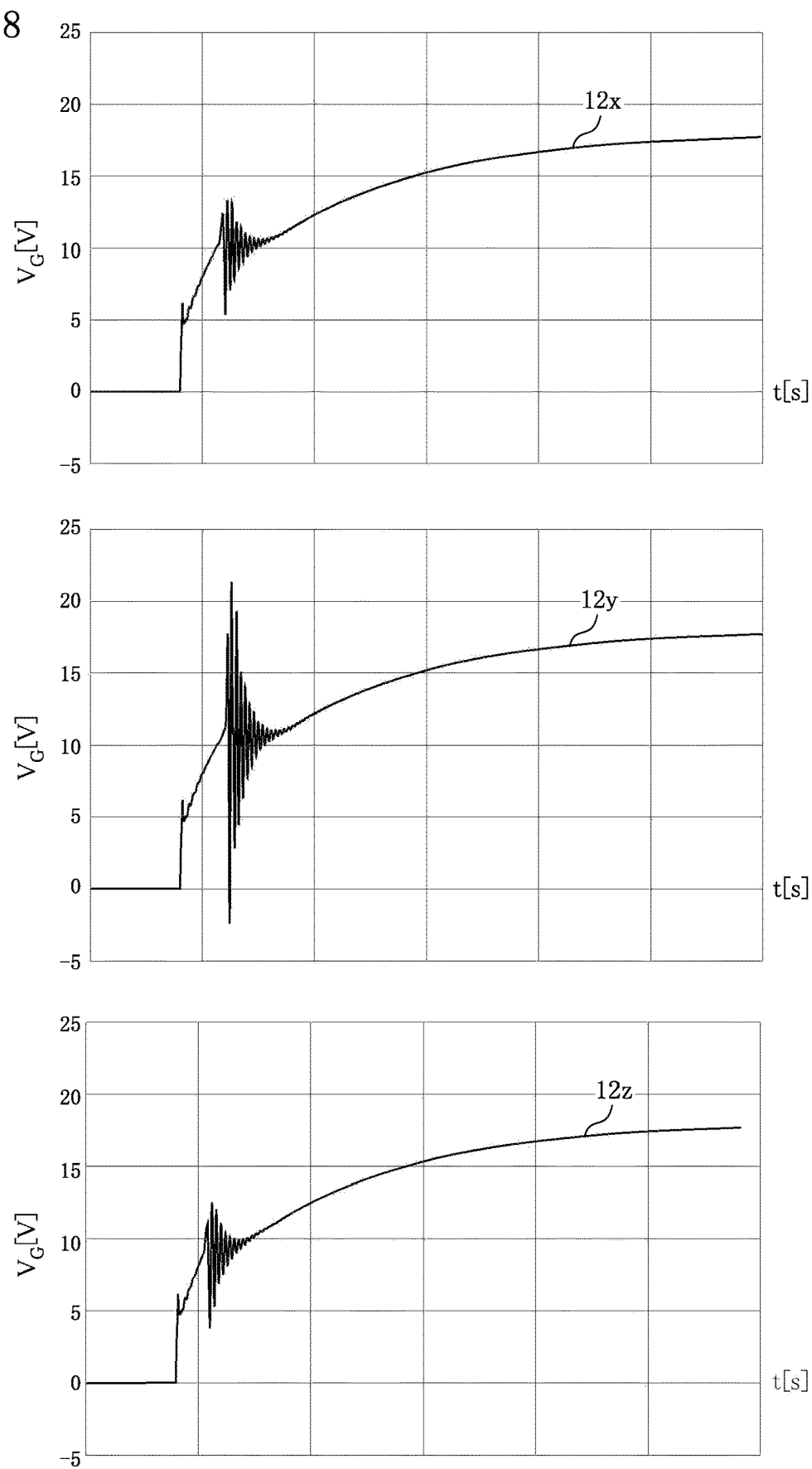

FIGS. 7 and 8 show the results of simulation performed under the simulation conditions described above. FIG. 7 shows the time variation of the drive signal during turn-off. FIG. 8 shows the time variation of the drive signal during turn-on. In FIGS. 7 and 8, the horizontal axis represents time, and the vertical axis represents the voltage value of the drive signal. In each of FIGS. 7 and 8, the top one shows the result when the second switching element 12x was used, the middle one shows the result when the second switching element 12y was used, and the bottom one shows the result when the second switching element 12z was used.

As shown in FIG. 7, during turn-off, the oscillations of the drive signal were large when the second switching element 12z was used, whereas the oscillations of the drive signal were relatively small when the second switching element 12x or 12y was used. As shown in FIG. 8, during turn-on, the oscillations of the drive signal were large when the second switching element 12y was used, whereas the oscillations of the drive signal were relatively small when the second switching element 12x or 12z was used. These simulation results indicate that oscillations of the drive signal are suppressed when the threshold voltage of the second switching element 12 is in the above-mentioned threshold set range relative to the threshold voltage of the first switching element 11. Thus, by setting the threshold voltage of the second switching element 12 in the above-mentioned threshold set range relative to the threshold voltage of the first switching element 11, the semiconductor device A1 can suppress the oscillations of the drive signal even in the case where the first switching element 11 and the second switching element 12 having different electrical characteristics are operated by a common drive signal. As a result, the semiconductor device A1 can eliminate the malfunctions of the first switching element 11 and the second switching element 12 (and hence, of the switching circuit 1). Moreover, as will be understood from the simulation results in FIGS. 7 and 8, the fact that the oscillations of the drive signal during turn-on were suppressed when the second switching element 12x or 12z was used indicates that the oscillations of the drive signal during turn-on can be suppressed by setting the threshold voltage of the second switching element 12 equal to or higher than the lower limit of the threshold set range. Also, the fact that the oscillations of the drive signal during turn-off were suppressed when the second switching element 12x or 12y was used indicates that the oscillations of the drive signal during turn-off can be suppressed by setting the threshold voltage of the second switching element 12 to be equal to or lower than the upper limit of the threshold set range.

Moreover, as will be understood from FIG. 6, the threshold voltage of the second switching element 12x changes from a value smaller than the threshold voltage of the first switching element 11 to a value greater than the threshold voltage of the first switching element 11 when the current in the switching circuit 1 is in a range equal to or greater than the second current and equal to or less than the third current value (in the range from 20 A to 60 A, inclusive). In the example shown in FIG. 6, the magnitude relationship between the threshold voltage of the first switching element 11 and the threshold voltage of the second switching element 12x is switched when the current in the switching circuit 1 is around 35 A. Such characteristics are advantageous for the control to make more current flow to the second switching element 12 (MOSFET) during switching (turn-on and turn-off) of the switching circuit 1 and make more current flow to the first switching element 11 (IGBT) when the switching circuit 1 is in a steady state.

In the semiconductor device A1, the first switching element 11 is made of the first semiconductor material, and the second switching element 12 is made of the second semiconductor material. The second semiconductor material has a wider bandgap than the first semiconductor material. The first semiconductor material is Si, for example, and the second semiconductor material is SiC, for example. SiC has a wider bandgap than Si, and switching elements using SiC have the advantage of lower power loss than switching elements using Si, for example. However, switching elements using SiC are more expensive than switching elements using Si. The semiconductor device A1 achieves both the reduction of power loss and the prevention of cost increase by making the first switching element 11 using the first semiconductor material (Si) and making the second switching element 12 using the second semiconductor material (SiC). Switching elements using SiC have a faster switching speed than switching elements using Si. Making the second switching element 12 using SiC is effective in reducing power loss (switching loss) during switching (turn-on and turn-off).

The first embodiment shows the example in which the first switching element 11 and the second switching element 12 are electrically connected in parallel within the semiconductor device A1 itself. Unlike this example, the parallel connection of the first switching element 11 and the second switching element 12 may be realized by using the circuit board on which the semiconductor device A1 is mounted. For example, the semiconductor device A1 may include an additional lead. The second lead 32 electrically conducts to the second electrode 112 of the first switching element 11, and the additional lead electrically conducts to the fifth electrode 122 of the second switching element 12. By mounting the semiconductor device A1 having such a configuration to a circuit board, the second lead 32 and the additional lead electrically conduct to each other. (For example, both leads are connected to a conductive member formed on the circuit board.)

The first embodiment shows the example in which the semiconductor device A1 receives a drive signal from the external drive circuit DR. Unlike this example, the drive circuit DR for generating a drive signal may be provided inside the resin member 2 (e.g., on the first lead 31).

FIGS. 9 to 14 show a semiconductor device A2 according to a second embodiment. As shown in the figures, the semiconductor device A2 is a module of a case type.

Figure 9:
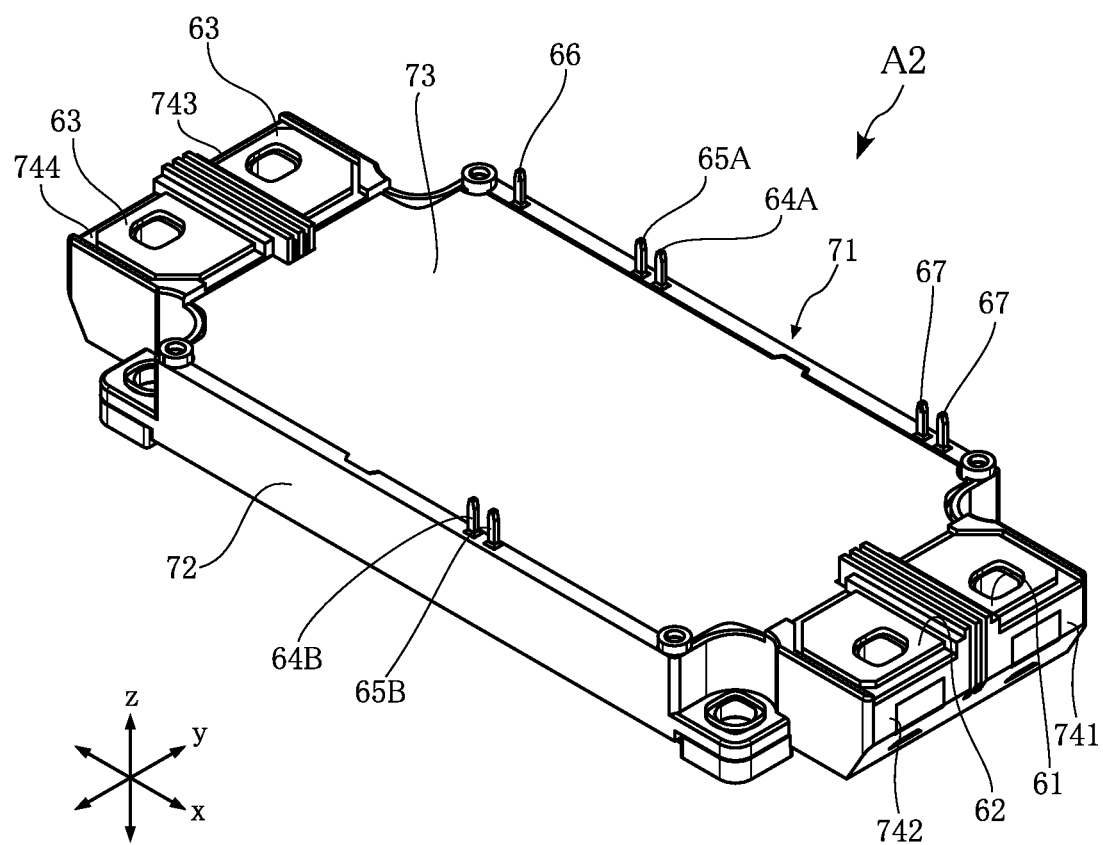
FIG. 9 is a perspective view showing a semiconductor device according to a second embodiment.
Figure 10:
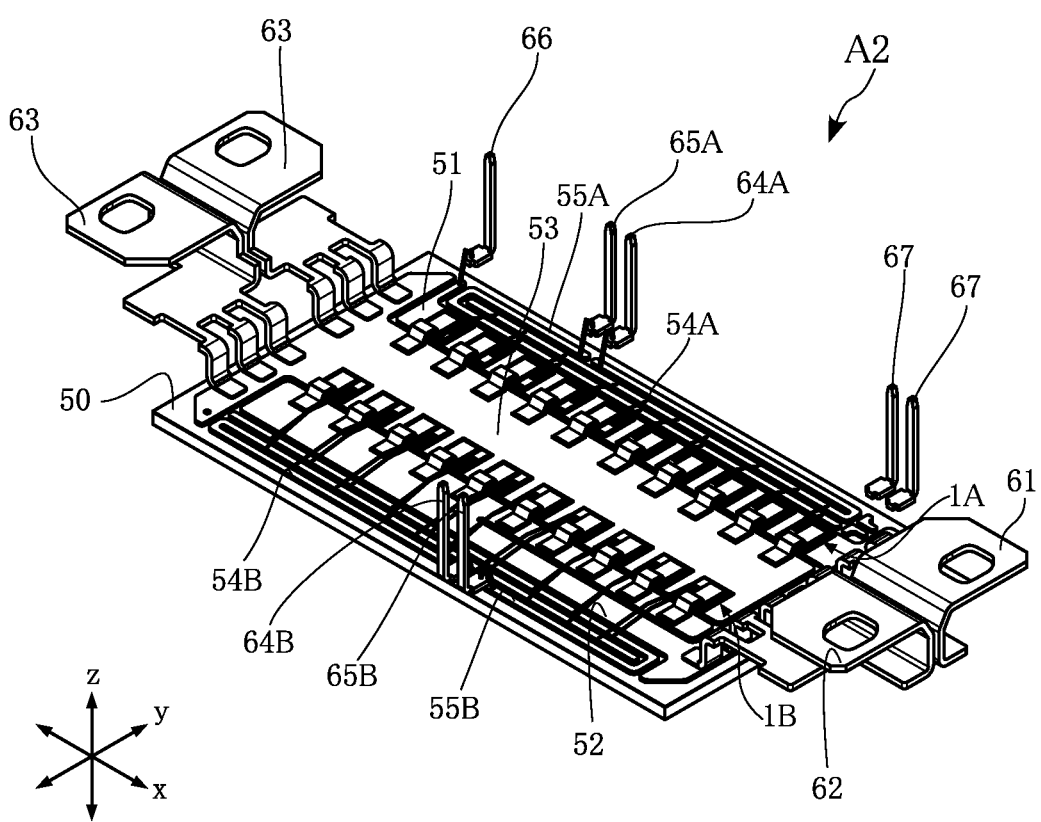
FIG. 10 is a perspective view corresponding to FIG. 9, in which a case and a heat dissipation plate are omitted.
Figure 11:
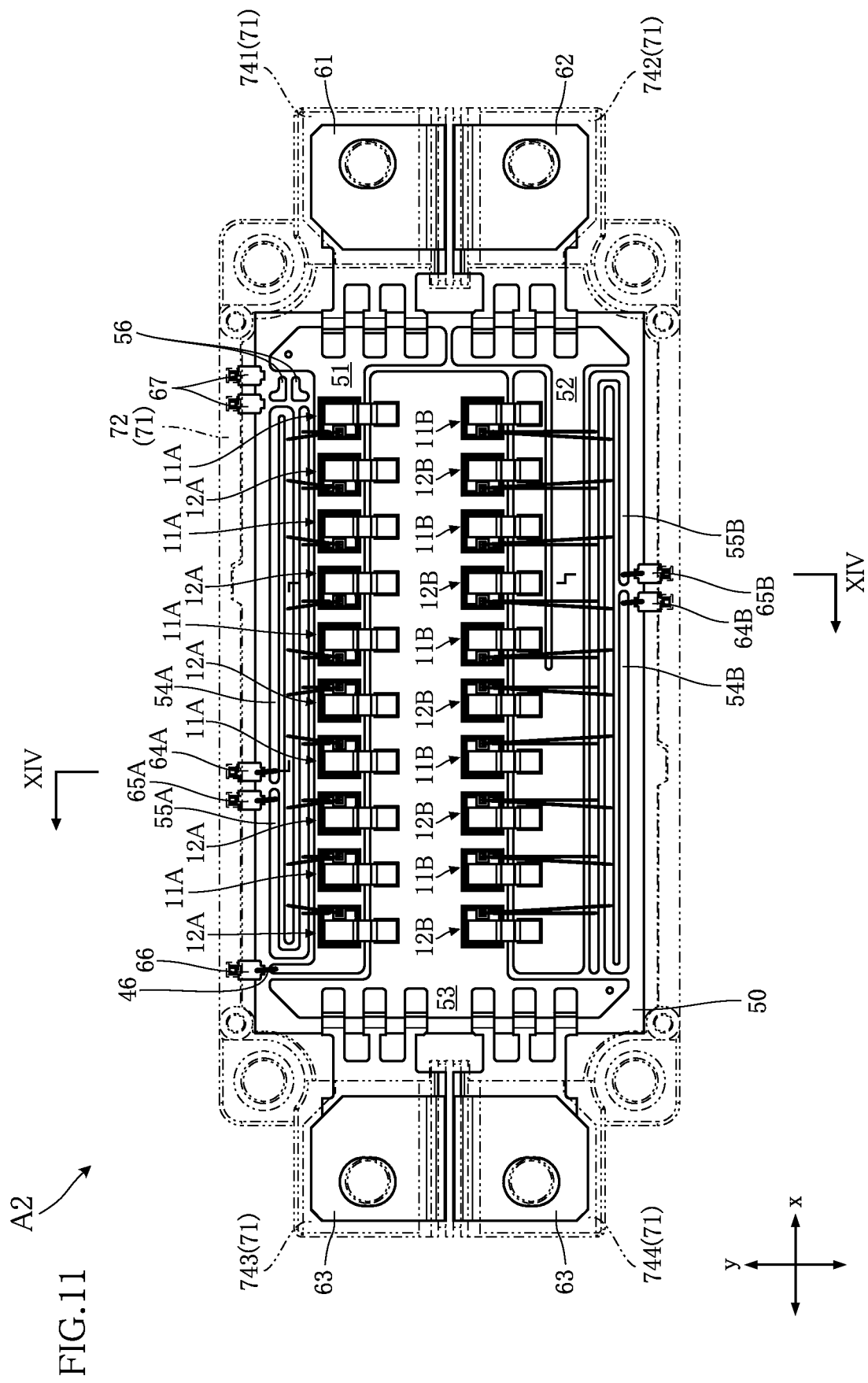
FIG. 11 is a plan view showing a semiconductor device according to a second embodiment, in which a case is shown by imaginary lines (two-dot chain lines).
Figure 12:
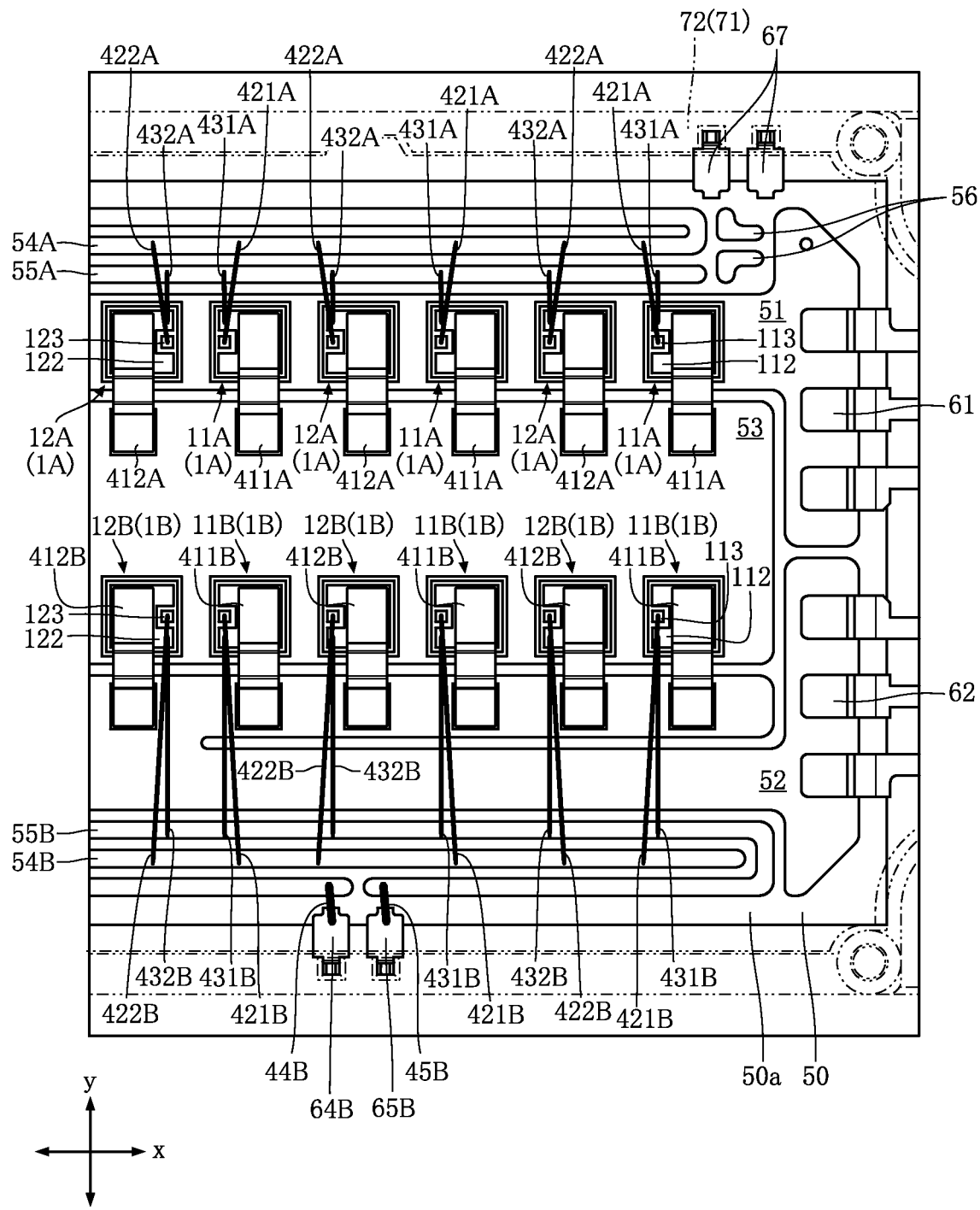
FIG. 12 is an enlarged view showing a part of FIG. 11.
Figure 13:
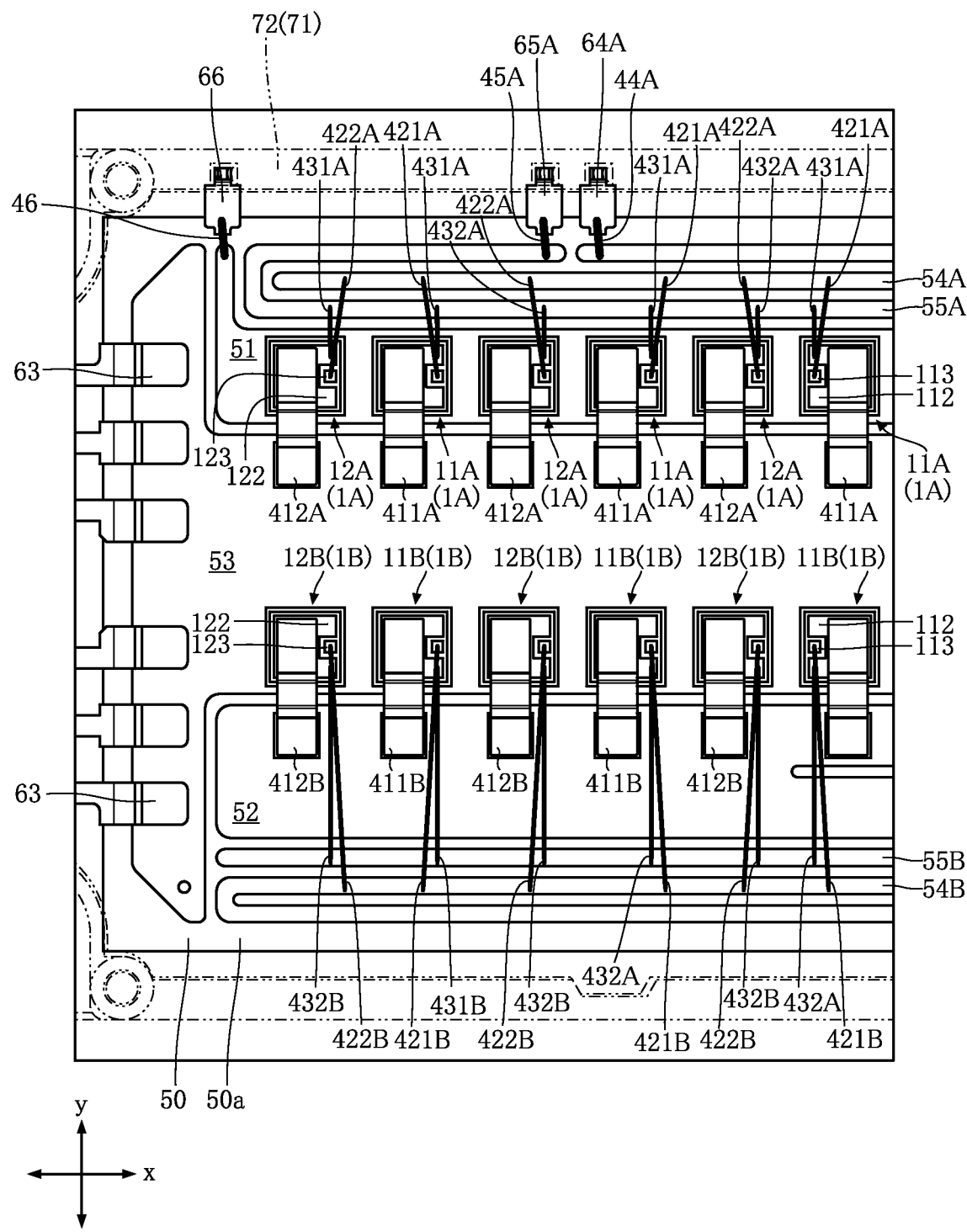
FIG. 13 is an enlarged view showing a part of FIG. 11.

As shown in FIGS. 9 to 14, the semiconductor device A2 includes a first switching circuit 1A, a second switching circuit 1B, an insulating substrate 50, a first power wiring portion 51, a second power wiring portion 52, a third power wiring portion 53, a pair of first signal wiring portions 54A and 54B, a pair of second signal wiring portions 55A and 55B, a pair of third signal wiring portions 56, a first power terminal 61, a second power terminal 62, two third power terminals 63, a pair of control terminals 64A and 64B, a pair of detection terminals 65A and 65B, a detection terminal 66, two detection terminals 67, a plurality of connecting members 4, a heat dissipation plate 70, and a case 71. In the semiconductor device A2, the plurality of connecting members 4 include a plurality of first connecting members 411A, 412A, 411B and 412B, a plurality of second connecting members 421A, 422A, 421B and 422B, a plurality of third connecting members 431A, 432A, 431B and 432B, a pair of fourth connecting members 44A and 44B, a pair of fifth connecting members 45A and 45B, and a sixth connecting member 46, as shown in FIGS. 11 to 13.

Figure 14:
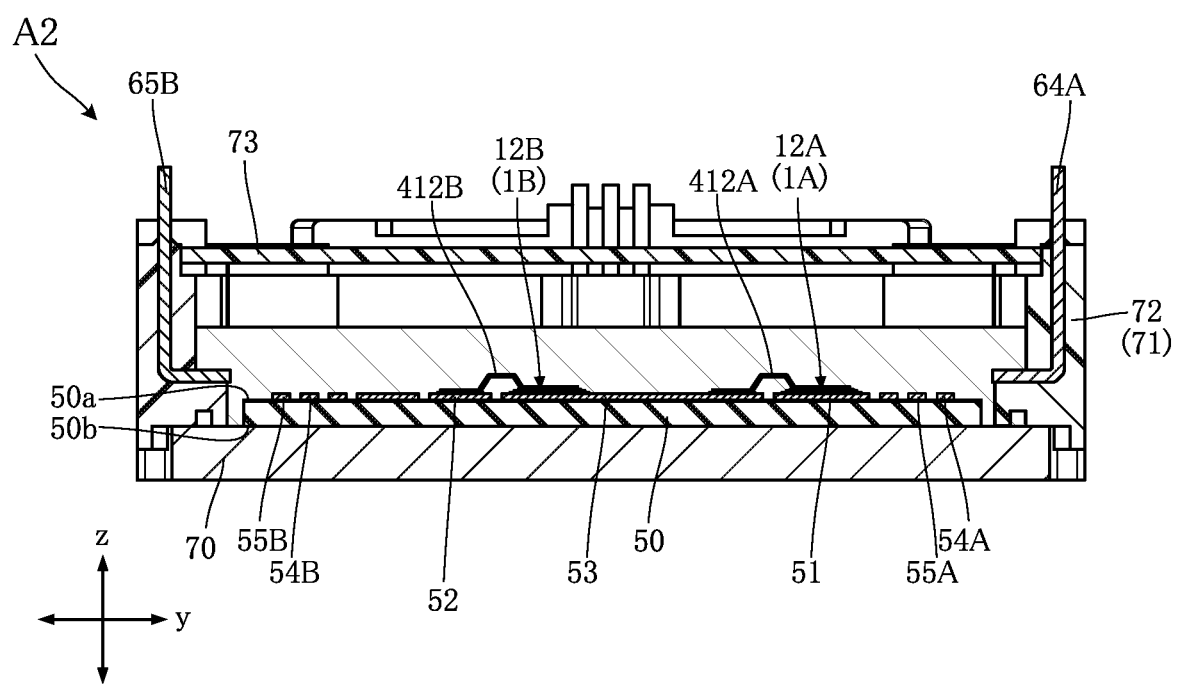
FIG. 14 is a sectional view taken along line XIV-XIV in FIG. 11.

The heat dissipation plate 70 is in the form of a flat plate that is rectangular in plan view, for example. The heat dissipation plate 70 is made of a material with high thermal conductivity and may be made of copper or a copper alloy, for example. The surface of the heat dissipation plate 70 may be Ni plated. A cooling member (e.g., a heat sink) may be attached to the lower surface of the heat dissipation plate in the thickness direction z as required. As shown in FIG. 14, the insulating substrate 50 is placed on the heat dissipation plate 70.

As will be understood from FIGS. 9 and 11, the case 71 is substantially a rectangular parallelepiped, for example. The case 71 is made of a synthetic resin with electrical insulation and excellent heat resistance and may be made of PPS (polyphenylene sulfide), for example. The case 71 is rectangular and has approximately the same size as the heat dissipation plate 70 in plan view. As shown in FIGS. 9, 11 and 14, the case 71 includes a frame 72, a top plate 73 and a plurality of terminal blocks 741 to 744.

The frame 72 is fixed to the upper surface of the heat dissipation plate 70 in the thickness direction z (see FIG. 14). The top plate 73 is fixed to the frame 72. As shown in FIGS. 9 and 14, the top plate 73 closes the upper opening of the frame 72 in the thickness direction z. As shown in FIG. 14, the top plate 73 faces the heat dissipation plate 70 that closes the lower side of the frame 72 in the thickness direction z. The top plate 73, the heat dissipation plate 70 and the frame portion 72 define a circuit housing space (the space that houses the first switching circuit 1A, the second switching circuit 1B, and the like) is defined inside the case 71.

The two terminal blocks 741 and 742 are disposed on one side of the frame 72 in the first direction x and formed integrally with the frame 72. The two terminal blocks 743 and 744 are disposed on the other side of the frame 72 in the first direction x and formed integrally with the frame 72. The two terminal blocks 741 and 742 are disposed on a side wall of the frame 72 on one side in the first direction x, side by side along the second direction y. The terminal block 741 covers a part of the first power terminal 61 and has a part of the first power terminal 61 disposed on its upper surface in the thickness direction z. The terminal block 742 covers a part of the second power terminal 62 and has a part of the second power terminal 62 disposed on its upper surface in the thickness direction z. The two terminal blocks 743 and 744 are disposed on a side wall of the frame 72 on the other side in the first direction x, side by side along the second direction y. The terminal block 743 covers a part of one of the two third power terminal 63 and has a part of the third power terminal 63 disposed on its upper surface in the thickness direction z. The terminal block 744 covers a part of the other one of the two third power terminals 63 and has a part of the third power terminal 63 disposed on its upper surface in the thickness direction z.

The first switching circuit 1A includes a plurality of first switching elements 11 and a plurality of second switching elements 12. For the convenience of understanding, the first switching elements 11 and the second switching elements 12 of the first switching circuit 1A are referred to as first switching elements 11A and second switching elements 12A, respectively. The first switching elements 11A and the second switching elements 12A are electrically connected in parallel with each other. A common first drive signal is input to the first switching elements 11A and the second switching elements 12A, and the switching operation is controlled based on the inputted first drive signal. In the example shown in FIG. 11, the first switching elements 11A and the second switching elements 12A are alternately arranged along the first direction x. Unlike this example, the first switching elements 11A may be disposed on one side of the second switching elements 12A in the first direction x. The order of arrangement of the first switching elements 11A and the second switching elements 12A is not particularly limited.

In the first switching circuit 1A, the electrical characteristics of the first switching elements 11A and the electrical characteristics of the second switching elements 12A have the following relationship. When the current flowing in the first switching circuit 1A is less than a first current value, the average of the voltages of the second switching elements 12A is lower than the average of the voltages of the first switching elements 11A. When the current flowing in the first switching circuit 1A is equal to or greater than a second current value and equal to or less than a third current value, the average of the threshold voltages of the second switching elements 12A is in the above-mentioned threshold set range (the range from −1.0 V to +0.4 V, inclusive) relative to the average of the threshold voltages of the first switching elements 11A.

The second switching circuit 1B includes a plurality of first switching elements 11 and a plurality of second switching elements 12. For the convenience of understanding, the first switching elements 11 and the second switching elements 12 of the second switching circuit 1B are referred to as first switching elements 11B and second switching elements 12B, respectively. The first switching elements 11B and the second switching elements 12B are electrically connected in parallel with each other. A common second drive signal is input to the first switching elements 11B and the second switching elements 12B, and the switching operation is controlled based on the inputted second drive signal. In the example shown in FIG. 11, the first switching elements 11B and the second switching elements 12B are alternately arranged along the first direction x. Unlike this example, the first switching elements 11B may be disposed on one side of the second switching elements 12B in the first direction x. The order of arrangement of the first switching elements 11B and the second switching elements 12B is not particularly limited.

In the second switching circuit 1B, the electrical characteristics of the first switching elements 11B and the electrical characteristics of the second switching elements 12B have the following relationship. When the current flowing in the second switching circuit 1B is less than a first current value, the average of the voltages of the second switching elements 12B is lower than the average of the voltages of the first switching elements 11B. When the current flowing in the second switching circuit 1B is equal to or greater than a second current value and equal to or less than a third current value, the average of the threshold voltages of the second switching elements 12B is in the above-mentioned threshold set range (the range from −1.0 V to +0.4 V, inclusive) relative to the average of the threshold voltages of the first switching elements 11B.

The first switching circuit 1A and the second switching circuit 1B are electrically connected in series according to the configuration detailed later. The first switching circuit 1A forms an upper arm circuit, and the second switching circuit 1B forms a lower arm circuit. The semiconductor device A2 performs power conversion by the switching operations of the first switching circuit 1A and the second switching circuit 1B. In the illustrated example, the semiconductor device A2 has five each of the first switching elements 11A, the first switching elements 11B, the second switching elements 12A and the second switching elements 12B. However, the number of these elements is not limited to this and may be changed as appropriate depending on the performance required of the semiconductor device A2. The number of first switching elements 11A and the number of second switching elements 12A may not be the same. The number of first switching elements 11B and the number of second switching elements 12B may not be the same.

As described above, the plurality of connecting members 4 include a plurality of first connecting members 411A, 412A, 411B and 412B, a plurality of second connecting members 421A, 422A, 421B and 422B, a plurality of third connecting members 431A, 432A, 431B and 432B, a pair of fourth connecting members 44A and 44B, a pair of fifth connecting members 45A and 45B, and a sixth connecting member 46. In the semiconductor device A2, the first connecting members 411A, 412A, 411B and 412B are, for example, in the form of a plate made of a metal (e.g., Cu or a Cu alloy). Other connecting members are bonding wires, for example.

As shown in FIGS. 11 to 13, each of the first connecting members 411A is bonded to the second electrode 112 of a first switching element 11A of the first switching circuit 1A and the third power wiring portion 53 to electrically conduct these to each other. Each of the first connecting members 412A is bonded to the fifth electrode 122 of a second switching element 12A of the first switching circuit 1A and the third power wiring portion 53 to electrically conduct these to each other.

As shown in FIGS. 11 to 13, each of the first connecting members 411B is bonded to the second electrode 112 of a first switching element 11B of the second switching circuit 1B and the second power wiring portion 52 to electrically conduct these to each other. Each of the first connecting members 412B is bonded to the fifth electrode 122 of a second switching element 12B of the second switching circuit 1B and the second power wiring portion 52 to electrically conduct these to each other.

As shown in FIGS. 11 to 13, each of the second connecting members 421A is bonded to the third electrode 113 of a first switching element 11A of the first switching circuit 1A and the first signal wiring portion 54A to electrically conduct these to each other. Each of the second connecting members 422A is bonded to the sixth electrode 123 of a second switching element 12A of the first switching circuit 1A and the first signal wiring portion 54A to electrically conduct these to each other.

As shown in FIGS. 11 to 13, each of the second connecting members 421B is bonded to the third electrode 113 of a first switching element 11B of the second switching circuit 1B and the first signal wiring portion 54B to electrically conduct these to each other. Each of the second connecting members 422B is bonded to the sixth electrode 123 of a second switching element 12B of the second switching circuit 1B and the first signal wiring portion 54B to electrically conduct these to each other.

As shown in FIGS. 11 to 13, each of the third connecting members 431A is bonded to the second electrode 112 of a first switching element 11A of the first switching circuit 1A and the second signal wiring portion 55A to electrically conduct these to each other. Each of the third connecting members 432A is bonded to the fifth electrode 122 of a second switching element 12A of the first switching circuit 1A and the second signal wiring portion 55A to electrically conduct these to each other.

As shown in FIGS. 11 to 13, each of the third connecting members 431B is bonded to the second electrode 112 of a first switching element 11B of the second switching circuit 1B and the second signal wiring portion 55B to electrically conduct these to each other. Each of the third connecting members 432B is bonded to the fifth electrode 122 of a second switching element 12B of the second switching circuit 1B and the second signal wiring portion 55B to electrically conduct these to each other.

As shown in FIGS. 11 to 13, the fourth connecting member 44A is bonded to the first signal wiring portion 54A and the control terminal 64A to electrically conduct these to each other. The fourth connecting member 44B is bonded to the first signal wiring portion 54B and the control terminal 64B to electrically conduct these to each other.

As shown in FIGS. 11 to 13, the fifth connecting member 45A is bonded to the second signal wiring portion 55A and the detection terminal 65A to electrically conduct these to each other. The fifth connecting member 45B is bonded to the second signal wiring portion 55B and the detection terminal to electrically conduct these to each other.

As shown in FIGS. 11 to 13, the sixth connecting member 46 is bonded to the first power wiring portion 51 and the detection terminal 66 to electrically conduct these to each other.

The insulating substrate 50 is electrically insulating. The constituent material of the insulating substrate 50 is, for example, ceramics having excellent thermal conductivity. Examples of such ceramics include AlN (aluminum nitride), SiN (silicon nitride), and $Al_2O_3$ (aluminum oxide). As shown in FIGS. 10 and 11, the insulating substrate 50 is a in the form of a flat plate that is rectangular in plan view, for example.

As shown in FIG. 14, the insulating substrate 50 has a substrate obverse surface 50a and a substrate reverse surface 50b. The substrate obverse surface 50a and the substrate reverse surface 50b are spaced apart from each other in the thickness direction z. The substrate obverse surface 50a faces upward in the thickness direction z, and the substrate reverse surface 50b faces downward in the thickness direction z.

As shown in FIGS. 11 to 14, for example, the first power wiring portion 51, the second power wiring portion 52, the third power wiring portion 53, the pair of first signal wiring portions 54A and 54B, the pair of second signal wiring portions 55A and 55B, and the pair of third signal wiring portions 56 are disposed on the substrate obverse surface 50a of the insulating substrate 50. The first power wiring portion 51, the second power wiring portion 52, the third power wiring portion 53, the pair of first signal wiring portions 54A and 54B, the pair of second signal wiring portions 55A and 55B, and the pair of third signal wiring portions 56 are, for example, metal layers. The metal layers are made of, for example, Cu or a Cu alloy. The metal layers may be made of aluminum or an aluminum alloy instead of Cu or a Cu alloy. The first power wiring portion 51, the second power wiring portion 52, the third power wiring portion 53, the pair of first signal wiring portions 54A and 54B, the pair of second signal wiring portions 55A and 55B, and the pair of third signal wiring portions 56 are spaced apart from each other.

As shown in FIGS. 11 to 13, the first switching circuit 1A (the first switching elements 11A and the second switching elements 12A) is mounted on the first power wiring portion 51. The first power wiring portion 51 electrically conducts to the first electrodes 111 of the first switching elements 11A and the fourth electrodes 121 of the second switching elements 12A. Thus, the first electrodes 111 (collector) of the first switching elements 11A and the fourth electrodes 121 (drain) of the second switching elements 12A are electrically connected to each other via the first power wiring portion 51.

As shown in FIGS. 11 to 13, the first connecting members 411B and the first connecting members 412B are bonded to the second power wiring portion 52. The second power wiring portion 52 electrically conducts to the second electrodes 112 of the first switching elements 11B via the first connecting members 411B. The second power wiring portion 52 electrically conducts to the fifth electrodes 122 of the second switching elements 12B via the first connecting members 412B. Thus, the second electrodes 112 (emitter) of the first switching elements 11B and the fifth electrodes 122 (source) of the second switching elements 12B are electrically connected to each other via the first connecting members 411B and 412B and the second power wiring portion 52.

As shown in FIGS. 11 to 13, the second switching circuit 1B (the first switching elements 11B and the second switching elements 12B) is mounted on the third power wiring portion 53. The third power wiring portion 53 electrically conducts to the first electrodes 111 of the first switching elements 11B and the fourth electrodes 121 of the second switching elements 12B. Thus, the first electrodes 111 (collector) of the first switching elements 11B and the fourth electrodes 121 (drain) of the second switching elements 12B are electrically connected to each other via the third power wiring portion 53. As shown in FIGS. 11 to 13, the first connecting members 411A and the first connecting members 412A are bonded to the third power wiring portion 53. The third power wiring portion 53 electrically conducts to the second electrodes 112 of the first switching elements 11A via the first connecting members 411A. The third power wiring portion 53 electrically conducts to the fifth electrodes 122 of the second switching elements 12A via the first connecting members 412A. Thus, the second electrodes 112 (emitter) of the first switching elements 11A and the fifth electrodes 122 (source) of the second switching elements 12A are electrically connected to each other via the first connecting members 411A and 412A and the third power wiring portion 53.

The semiconductor device A2 includes the first power wiring portion 51 as a first conductor and the third power wiring portion 53 as a second conductor for the first switching circuit 1A. The semiconductor device A2 also includes the third power wiring portion 53 as a first conductor and the second power wiring portion 52 as a second conductor for the second switching circuit 1B.

As shown in FIGS. 11 to 13, the second connecting members 421A and the second connecting members 422A are bonded to the first signal wiring portion 54A. The first signal wiring portion 54A electrically conducts to the third electrodes 113 (gate) of the first switching elements 11A via the second connecting members 421A. The first signal wiring portion 54A electrically conducts to the sixth electrodes 123 (gate) of the second switching elements 12A via the second connecting members 422A. The first signal wiring portion 54A transmits a first drive signal that controls the switching operation of the first switching circuit 1A (the switching operations of the first switching elements 11A and the second switching elements 12A).

As shown in FIGS. 11 to 13, the second connecting members 421B and the second connecting members 422B are bonded to the first signal wiring portion 54B. The first signal wiring portion 54B electrically conducts to the third electrodes 113 of the first switching elements 11B via the second connecting members 421B. The first signal wiring portion 54B electrically conducts to the sixth electrodes 123 (gate) of the second switching elements 12B via the second connecting members 422B. The first signal wiring portion 54B transmits a second drive signal that controls the switching operation of the second switching circuit 1B (the switching operations of the first switching elements 11B and the second switching elements 12B).

As shown in FIGS. 11 to 13, the third connecting members 431A and the third connecting members 432A are bonded to the second signal wiring portion 55A. The second signal wiring portion 55A electrically conducts to the second electrodes 112 (emitter) of the first switching elements 11A via the third connecting members 431A. The second signal wiring portion 55A electrically conducts to the fifth electrodes 122 (source) of the second switching elements 12A via the third connecting members 432A. The second signal wiring portion transmits a first detection signal that indicates the conduction state of the first switching circuit 1A. Voltages of the second electrodes 112 of the first switching elements 11A and the fifth electrodes 122 of the second switching elements 12A are applied to the second signal wiring portion 55A.

As shown in FIGS. 11 to 13, the third connecting members 431B and the third connecting members 432B are bonded to the second signal wiring portion 55B. The second signal wiring portion 55B electrically conducts to the second electrodes 112 (emitter) of the first switching elements 11B via the third connecting members 431B. The second signal wiring portion 55B electrically conducts to the fifth electrodes 122 (source) of the second switching elements 12B via the third connecting members 432B. The second signal wiring portion transmits a second detection signal that indicates the conduction state of the second switching circuit 1B. Voltages of the second electrodes 112 of the first switching elements 11B and the fifth electrodes 122 of the second switching elements 12B are applied to the second signal wiring portion 55B.

In the example shown in FIGS. 10 to 12, nothing is connected to the pair of third signal wiring portions 56. However, a thermistor may be connected in a structure different from the semiconductor device A2. The thermistor is disposed to bridge over the pair of third signal wiring portions 56.

Each of the first power terminal 61, the second power terminal 62, the two third power terminals 63, the pair of control terminals 64A and 64B, the pair of detection terminals 65A and 65B, the detection terminal 66, and the pair of detection terminals 67 is partially exposed from the case 71. The first power terminal 61, the second power terminal 62, the two third power terminals 63, the pair of control terminals 64A and 64B, the pair of detection terminals 65A and 65B, the detection terminal 66, and the pair of detection terminals 67 are made of copper or a copper alloy.

As shown in FIGS. 11 and 12, the first power terminal 61 is bonded to the first power wiring portion 51 inside the case 71. The first power terminal 61 electrically conducts to the first electrodes 111 of the first switching elements 11A and the fourth electrodes 121 of the second switching elements 12A via the first power wiring portion 51.

As shown in FIGS. 11 and 12, the second power terminal 62 is bonded to the second power wiring portion 52 inside the case 71. The second power terminal 62 electrically conducts to the second electrodes 112 of the first switching elements 11B and the fifth electrodes 122 of the second switching elements 12B via the second power wiring portion 52.

As shown in FIGS. 11 and 13, the two third power terminals 63 are bonded to the third power wiring portion 53 inside the case 71. Each of the two third power terminals 63 electrically conducts to the second electrodes 112 of the first switching elements 11A, the fifth electrodes 122 of the second switching elements 12A, the first electrodes 111 of the first switching elements 11B and the fourth electrodes 121 of the second switching elements 12B.

In semiconductor device A2, the first power terminal 61 and the second power terminal 62 are connected to a power supply, and a power supply voltage (e.g., DC voltage) is applied to these terminals. In an example, the first power terminal 61 is the positive pole (P terminal), and the second power terminal 62 is the negative pole (N terminal). The first power terminal 61 and the second power terminal 62 are spaced apart from each other and arranged along the second direction y. The two third power terminals 63 output the voltage (e.g., AC voltage) converted by the switching operations of the first switching circuit 1A and the switching operation of the second switching circuit 1B. Each of the two third power terminals 63 is a power output terminal (OUT terminal). The two third power terminals 63 are spaced apart from each other and arranged along the second direction y. In the first direction x, the first power terminal 61 and the second power terminal 62 are disposed on one side of the insulating substrate 50, and the two third power terminals 63 are disposed on the other side of the insulating substrate 50. In a structure different from the semiconductor device A2, only one of the two third power terminals 63 may be provided. In such a case, the third power terminal 63 may be provided at the center in the second direction y of the side wall of the frame 72 on one side in the first direction x.

As shown in FIG. 13, the fourth connecting member 44A is bonded to the control terminal 64A. The control terminal 64A electrically conducts to the first signal wiring portion 54A via the fourth connecting member 44A. Thus, the control terminal 64A electrically conducts to each of the third electrodes 113 of the first switching elements 11A and each of the sixth electrodes 123 of the second switching elements 12A. The control terminal 64A is the input terminal for the first drive signal.

As shown in FIG. 12, the fourth connecting member 44B is bonded to the control terminal 64B. The control terminal 64B electrically conducts to the first signal wiring portion 54B via the fourth connecting member 44B. Thus, the control terminal 64B electrically conducts to each of the third electrodes 113 of the first switching elements 11B and each of the sixth electrodes 123 of the second switching elements 12B. The control terminal 64B is the input terminal for the second drive signal.

As shown in FIG. 13, the fifth connecting member 45A is bonded to the detection terminal 65A. The detection terminal electrically conducts to the second signal wiring portion via the fifth connecting member 45A. Thus, the detection terminal 65A electrically conducts to each of the second electrodes 112 of the first switching elements 11A and each of the fifth electrodes 122 of the second switching elements 12A. The detection terminal 65A is the output terminal for the first detection signal.

As shown in FIG. 12, the fifth connecting member 45B is bonded to the detection terminal 65B. The detection terminal 65B electrically conducts to the second signal wiring portion via the fifth connecting member 45B. Thus, the detection terminal 65B electrically conducts to each of the second electrodes 112 of the first switching elements 11B and each of the fifth electrodes 122 of the second switching elements 12B. The detection terminal 65B is the output terminal for the second detection signal.

As shown in FIG. 13, the sixth connecting member 46 is bonded to the detection terminal 66. The detection terminal 66 electrically conducts to the first power wiring portion 51 via the sixth connecting member 46. Thus, the detection terminal 66 electrically conducts to each of the first electrodes 111 of the first switching elements 11A and each of the fourth electrodes 121 of the second switching elements 12A. The detection terminal 66 is the output terminal for the third detection signal. The third detection signal is a signal for detecting the voltage applied to the first power wiring portion 51.

When a thermistor is connected to the pair of third signal wiring portions 56, the pair of detection terminals 67 serve as the terminals for detecting the temperature inside the case 71. Since no thermistor is connected to the third signal wiring portions 56 in the semiconductor device A2, each of the detection terminals 67 is a non-connected terminal.

When the current flowing in the first switching circuit 1A is less than the first current value, the average of the voltages of the second switching elements 12A is lower than the average of the voltages of the first switching elements 11A. When the current flowing in the first switching circuit 1A is equal to or greater than a second current value and equal to or less than a third current value, the average of the threshold voltages of the second switching elements 12A is in the above-mentioned threshold set range (the range from −1.0 V to +0.4 V, inclusive) relative to the average of the threshold voltages of the first switching elements 11A. With such a configuration, the semiconductor device A2 can reduce power loss in the first switching circuit 1A, as with the switching circuit 1 of the semiconductor device A1. Moreover, even in the case where the first switching elements 11A and the second switching elements 12A are operated by a common first drive signal, the semiconductor device A2 can suppress the oscillations of the first drive signal. That is, the semiconductor device A2 can eliminate the malfunctions of the first switching elements 11A and the second switching elements 12A. This holds for the second switching circuit 1B. That is, the semiconductor device A2 can reduce power loss in the second switching circuit 1B. Moreover, even in the case where the first switching elements 11B and the second switching elements 12B are operated by a common second drive signal, the semiconductor device A2 can suppress the oscillations of the second drive signal. Thus, the semiconductor device A2 can eliminate the malfunctions of the first switching elements 11B and the second switching elements 12B.

Figure 15:
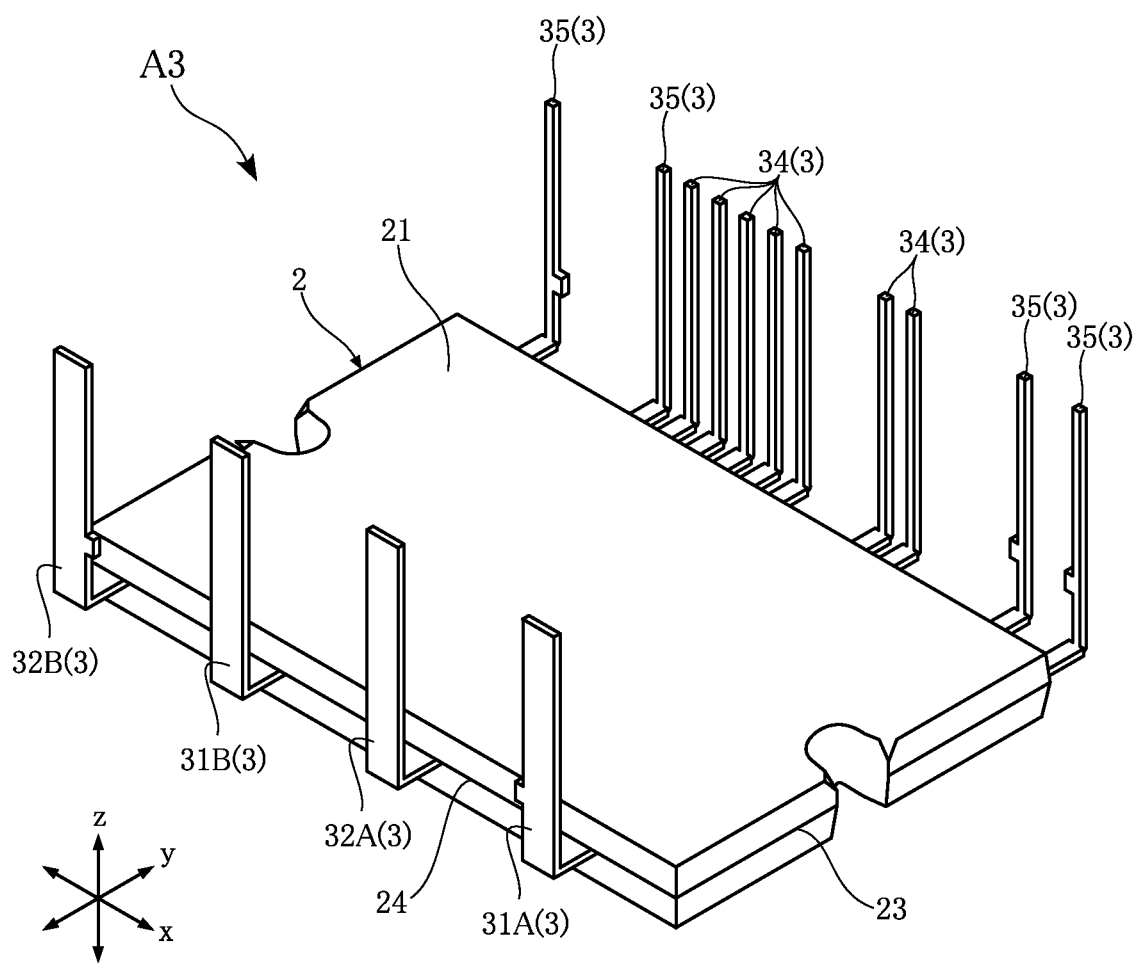
FIG. 15 is a perspective view showing a semiconductor device according to a third embodiment.
Figure 16:
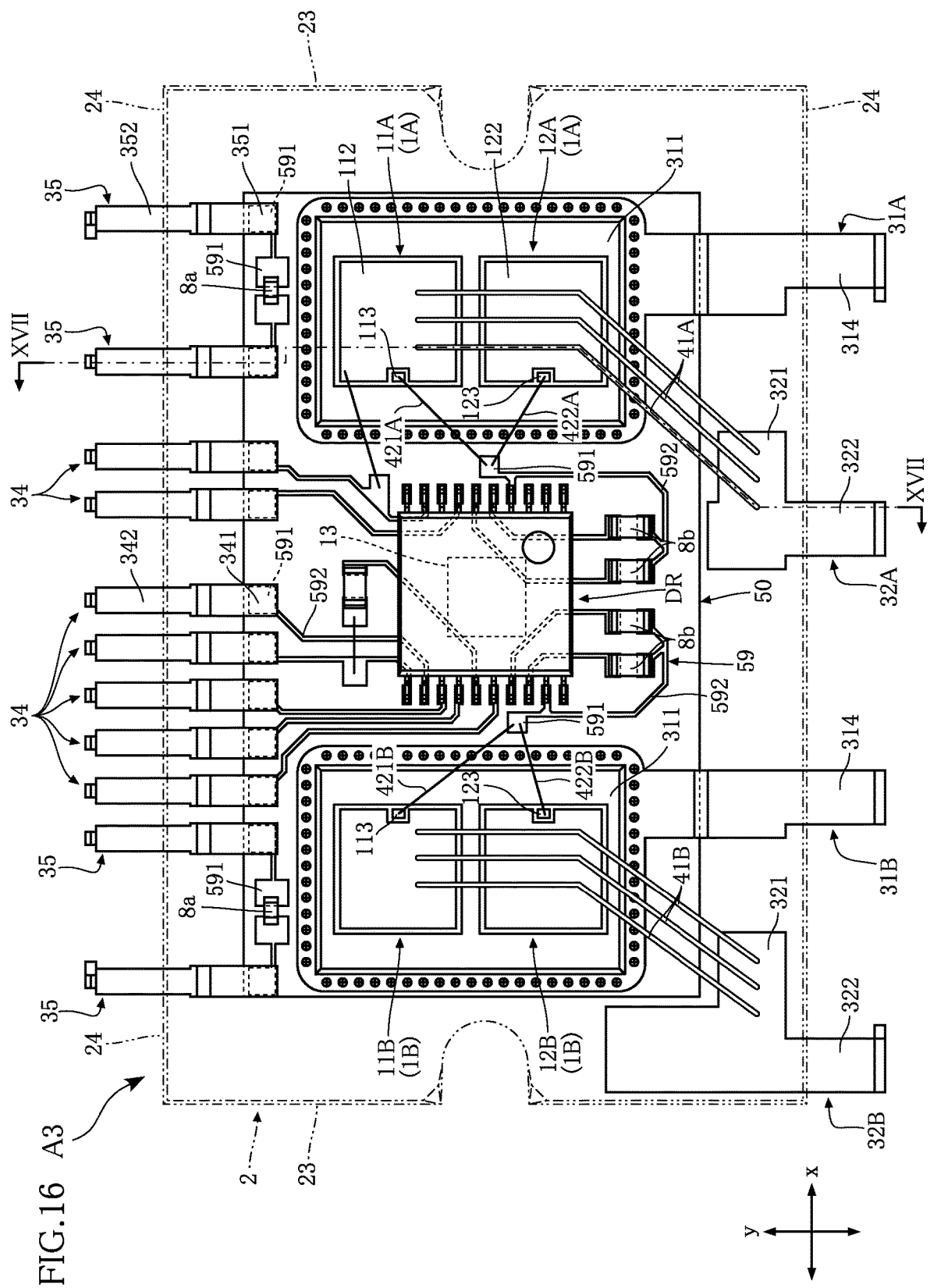
FIG. 16 is a plan view showing the semiconductor device according to the third embodiment, in which a resin member is shown by imaginary lines (two-dot chain lines).
Figure 17:
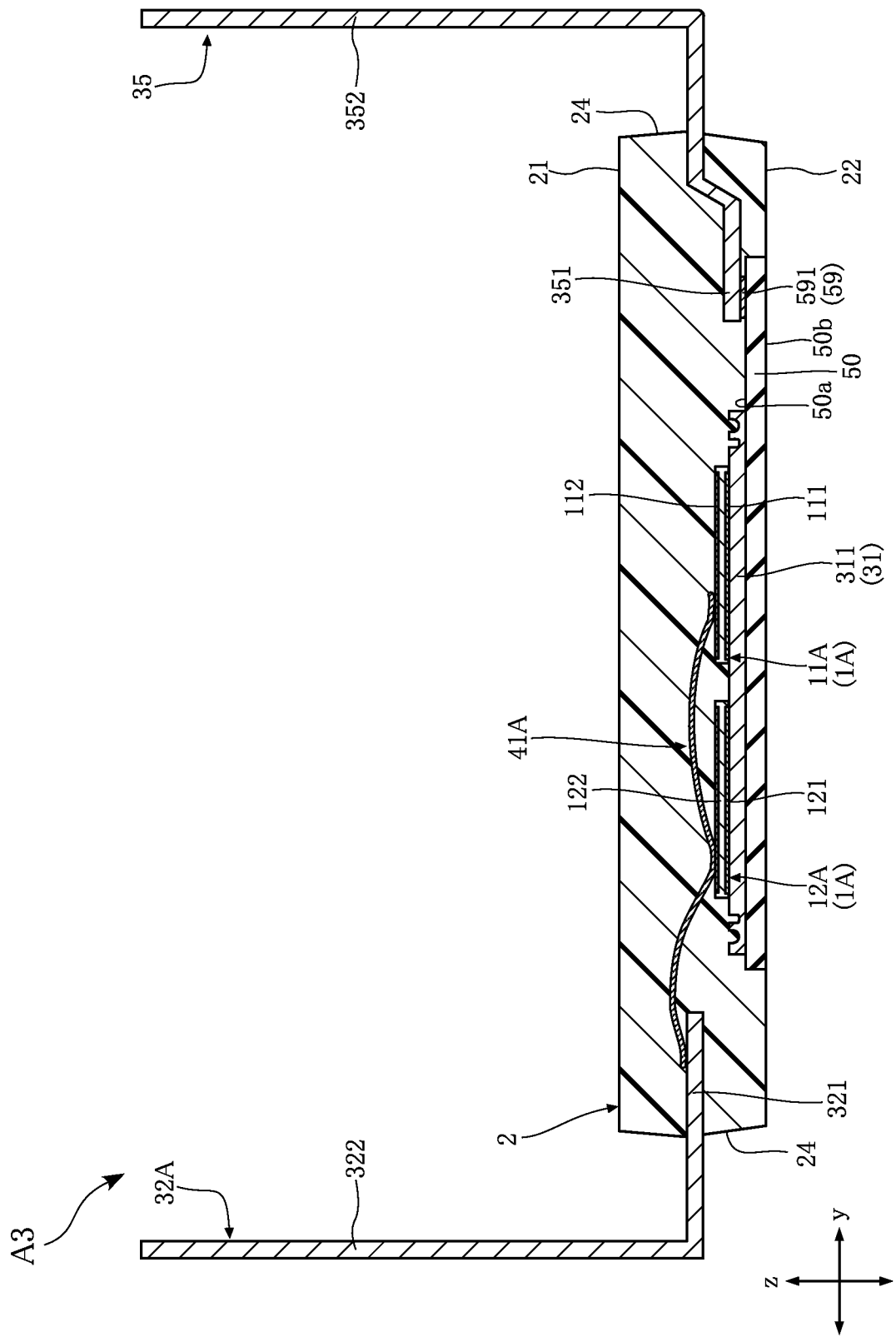
FIG. 17 is a sectional view taken along line XVII-XVII in FIG. 16.

FIGS. 15 to 17 show a semiconductor device A3 according to a third embodiment. The semiconductor device A3 is, for example, an IPM (Intelligent Power Module) and has a drive circuit DR for outputting a drive signal to the first switching elements 11 and the second switching elements 12.

As shown in FIGS. 15 to 17, the semiconductor device A3 includes a first switching circuit 1A, a second switching circuit 1B, the drive circuit DR, a resin member 2, a plurality of leads 3, a plurality of connecting members 4, an insulating substrate 50, a wiring portion 59 and a plurality of passive elements 8. In the semiconductor device A3, the plurality of leads 3 include a pair of first leads 31A and 31B, a pair of second leads 32A and 32B, a plurality of fourth leads lead 34, and a plurality of fifth leads 35, as shown in FIG. 15. As shown in FIG. 16, the connecting members 4 include a plurality of first connecting members 41A and 41B and a plurality of second connecting members 421A, 422A, 421B and 422B.

In the semiconductor device A3, the first switching circuit 1A includes one each of the first switching element 11A and the second switching element 12A. The electrical characteristics of the first switching element 11A and the electrical characteristics of the second switching element 12A have the following relationship. When the current flowing in the first switching circuit 1A is less than a first current value, the voltage of the second switching element 12A is lower than the voltage of the first switching element 11A. When the current flowing in the first switching circuit 1A is equal to or greater than a second current value and equal to or less than a third current value, the threshold voltage of the second switching element 12A is in the above-mentioned threshold set range (the range from −1.0 V to +0.4 V, inclusive) relative to the threshold voltage of the first switching element 11A.

In the semiconductor device A3, the second switching circuit 1B includes one each of the first switching element 11B and the second switching element 12B. The electrical characteristics of the first switching element 11B and the electrical characteristics of the second switching element 12B have the following relationship. When the current flowing in the second switching circuit 1B is less than a first current value, the voltage of the second switching element 12B is lower than the voltage of the first switching element 11B. When the current flowing in the second switching circuit 1B is equal to or greater than a second current value and equal to or less than a third current value, the threshold voltage of the second switching element 12B is in the above-mentioned threshold set range (the range from −1.0 V to +0.4 V, inclusive) relative to the threshold voltage of the first switching element 11B.

The drive circuit DR controls the switching operation of the first switching circuit 1A (the switching operation of each of the first switching element 11A and the second switching element 12A) while controlling the switching operation of the second switching circuit 1B (the switching operation of each of the first switching element 11B and the second switching element 12B). The drive circuit DR is disposed on the substrate obverse surface 50a. As shown in FIG. 16, the drive circuit DR is configured as, for example, an SOP (Small Outline Package) type and includes a resin package and a plurality of connection terminals. The package type of the drive circuit DR is not limited to the SOP, and may be the QFP (Quad Flat Package), the SOJ (Small Outline J-lead Package), the QFN (Quad Flatpack No Lead) or the SON (Small-Outline No Lead), for example.

The drive circuit DR includes a drive element 13. The drive element 13 is covered with a resin package. The drive element 13 generates a first drive signal and a second drive signal. The drive element 13 electrically conducts to the connection terminals, and the connection terminals are conductively bonded to the pad portions 591 (the wiring portion 59), described later, with a conductive bonding material (e.g., solder, metal paste or sintered metal) not shown. The drive element 13 electrically conducts to the third electrode 113 of the first switching element 11A via the wiring portion 59 and the second connecting member 421A and electrically conducts to the sixth electrode 123 of the second switching element 12A via the wiring portion 59 and the second connecting member 422A. The drive element 13 inputs a common first drive signal to the third electrode 113 of the first switching element 11A and the sixth electrode 123 of the second switching element 12A. The drive element 13 electrically conducts to the third electrode 113 of the first switching element 11B via the wiring portion 59 and the second connecting member 421B and electrically conducts to the sixth electrode 123 of the second switching element 12B via the wiring portion 59 and the second connecting member 422B. The drive element 13 inputs a common second drive signal to the third electrode 113 of the first switching element 11B and the sixth electrode 123 of the second switching element 12B. Unlike the example shown in FIG. 16, the drive element 13 may not be covered with a resin package.

The insulating substrate 50 of the semiconductor device A3 is in the form of a flat plate and made of, for example, ceramics, as with the insulating substrate 50 of the semiconductor device A2. Preferably, the insulating substrate 50 of the semiconductor device A3 is made of a material having a higher thermal conductivity than, for example, the resin member 2. The first switching circuit 1A, the second switching circuit 1B, the drive circuit DR, the two first leads 31A and 31B, the two second leads 32A and 32B, the passive elements 8, and the like are mounted on the insulating substrate 50 of the semiconductor device A3. The substrate obverse surface 50a is formed with the wiring portion 59. The substrate reverse surface 50b is exposed from the resin member 2 (the resin reverse surface 22). The substrate reverse surface 50b may be covered with the resin member 2.

As shown in FIGS. 16 and 17, the wiring portion 59 is formed on the substrate obverse surface 50a. The wiring portion 59 is made of an electrically conductive material. Silver or a silver alloy may be used as the constituent material of the wiring portion 59. Instead of silver or a silver alloy, copper or a copper alloy, or gold or a gold alloy may be used as the constituent material of the wiring portion 59. The wiring portion 59 is formed by printing a paste material containing the constituent material described above and then baking the paste material. The method for forming the wiring portion 59 is not limited to this and may be changed as appropriate depending on the constituent material used. The wiring portion 59 is a conduction path to the drive circuit DR. Control signals for controlling the first switching circuit 1A and the second switching circuit 1B flow through the wiring portion 59. The control signals include the first drive signal, the second drive signal, a first detection signal and a second detection signal and the like. The wiring portion 59 also transmits the operating power for the drive circuit DR.

As shown in FIG. 16, the wiring portion 59 includes a plurality of pad portions 591 and a plurality of connection wirings 592. The shape in plan view of each pad portion 591 is not particularly limited, but may be rectangular. The shape in plan view of each pad portion 591 may be, for example, circular, oval or polygonal. The pad portions 591 are spaced apart from each other. The pad portions 591 are the portions to which other constituent parts are bonded as appropriate. In the semiconductor device A3, the drive circuit DR, the passive elements 8, the fourth leads 34, the fifth leads 35 and the second connecting members 421A, 422A, 421B and 422B are bonded to the pad portions 591. The connection wirings 592 connect between the pad portions 591. In the wiring portion 59, the positions and shapes of the pad portions 591 and the connection wirings 592 are not limited to the illustrated example.

As shown in FIG. 16, the passive elements 8 are disposed on the substrate obverse surface 50a of the insulating substrate 50. Each passive element 8 is bonded to a pad portion 591 (the wiring portion 59) and electrically conducts to the wiring portion 59. The passive elements 8 may be, for example, a resistor, a capacitor, a coil, or a diode. The passive elements 8 include, for example, thermistors 8a and resistors 8b.

Each of the thermistors 8a is disposed to bridge over two pad portions 591 of the wiring portion 59 and conductively bonded to the two pad portions 591. The pad portions 591 electrically conduct to relevant two fifth leads 35 via connection wirings 592. When a voltage is applied between the two fifth leads 35, the thermistor 8a outputs a current corresponding to the ambient temperature.

Each of the resistors 8b is disposed to bridge over two pad portions 591 of the wiring portion 59 and conductively bonded to the two pad portions 591. One of the two pad portions 591 to which a resistor 8b is bonded electrically conducts to the drive circuit DR (the drive element 13), and the other to the third electrode 113 of the first switching element 11A or 11B or to the sixth electrode 123 of the second switching element 12A or 12B via a second connecting member 421A, 422A, 421B or 422B. Each resistor 8b is a gate resistor, for example. Unlike the illustrated example, the passive elements 8 may not include any resistors 8b.

In the semiconductor device A3, the plurality of leads 3 include the two first leads 31A and 31B, the two second leads 32A and 32B, the fourth leads 34, and the fifth leads 35. The two first leads 31A and 31B, the two second lead 32A and 32B, the fourth leads 34 and the fifth leads 35 are spaced apart from each other.

The two first leads 31A and 31B are supported by the resin member 2 and also supported by the insulating substrate 50. As shown in FIG. 16, each of the two first leads 31A and 31B includes a die pad 311 and a terminal portion 314. In each of the first leads 31A and 31B, the die pad 311 and the terminal portion 314 are connected to each other.

In each of the first leads 31A and 31B, the die pad 311 is covered with the resin member 2. The die pad 311 is disposed on the substrate obverse surface 50a of the insulating substrate 50 and overlaps with the insulating substrate 50 in plan view. The die pad 311 may be rectangular in plan view. The die pad 311 is bonded to the substrate obverse surface 50a with a bonding material not shown. To increase the bonding strength between the die pad 311 and the insulating substrate 50, a metal layer may be provided on the substrate obverse surface 50a to which the die pad 311 is bonded. By using the same material as the wiring portion 59, the metal layer can be formed together with the wiring portion 59.

The first switching element 11A and the second switching element 12A of the first switching circuit 1Aa are mounted on the die pad 311 of the first lead 31A. The die pad 311 of the first lead 31A electrically conducts to the first electrode 111 of the first switching element 11A and the fourth electrode 121 of the second switching element 12A. Thus, the first electrode 111 (collector) of the first switching element 11A and the fourth electrode 121 (drain) of the second switching element 12A electrically conduct to each other via the die pad 311 of the first lead 31A.

The first switching element 11B and the second switching element 12B of the second switching circuit 1B are mounted on the die pad 311 of the first lead 31B. The die pad 311 of the first lead 31B electrically conducts to the first electrode 111 of the first switching element 11B and the fourth electrode 121 of the second switching element 12B. Thus, the first electrode 111 (collector) of the first switching element 11B and the fourth electrode 121 (drain) of the second switching element 12B electrically conduct to each other via the die pad 311 of the first lead 31B.

In each of the first leads 31A and 31B, the terminal portion 314 is exposed from the resin member 2. The terminal portion 314 is bent upward in the thickness direction z. The terminal portion 314 is an external terminal of the semiconductor device A3.

The two second leads 32A and 32B are supported by the resin member 2. Each of the two second leads 32A and 32B includes a pad portion 321 and a terminal portion 322. In each of the second leads 32A and 32B, the pad portion 321 and the terminal portion 322 are connected to each other.

In each of the second leads 32A and 32B, the pad portion 321 is covered with the resin member 2. The pad portion 321 does not overlap with the insulating substrate 50 in plan view. The first connecting members 41A are bonded to the pad portion 321 of the second lead 32A. The pad portion 321 of the second lead 32A electrically conducts to the second electrode 112 (emitter) of the first switching element 11A and the fifth electrode 122 (source) of the second switching element 12A via the first connecting members 41A. The first connecting members 41B are bonded to the pad portion 321 of the second lead 32B. The pad portion 321 of the second lead 32B electrically conducts to the second electrode 112 (emitter) of the first switching element 11B and the fifth electrode 122 (source) of the second switching element 12B via the first connecting members 41B.

In each of the second leads 32A and 32B, the terminal portion 322 is exposed from the resin member 2. The terminal portion 322 is bent upward in the thickness direction z. The terminal portion 322 is an external terminal of the semiconductor device A3.

In the semiconductor device A3, the second lead 32A and the first lead 31B may be physically separated and electrically connected to each other on the circuit board on which the semiconductor device A3 is mounted. Unlike this example, the second lead 32A and the first lead 31B may be electrically connected to each other inside the resin member 2.

The semiconductor device A3 includes the first lead 31A as a first conductor and the second lead 32A as a second conductor for the first switching circuit 1A. The semiconductor device A3 also includes the first lead 31B as a first conductor and the second lead 32B as a second conductor for the second switching circuit 1B.

The fourth leads 34 are supported by the resin member 2 and also supported by the insulating substrate 50. As shown in FIG. 16, each of the fourth leads 34 includes a pad portion 341 and a terminal portion 342. In each fourth lead 34, the pad portion 341 and the terminal portion 342 are connected to each other.

Each pad portion 341 is covered with the resin member 2. Each pad portion 341 is disposed on the substrate obverse surface 50a of the insulating substrate 50 and overlaps with the insulating substrate 50 in plan view. Each pad portion 341 is bonded to a relevant one of the pad portions 591 with a conductive bonding material not shown. Each pad portion 591 to which a pad portion 341 is bonded electrically conducts to the drive circuit DR (the drive element 13) via a connection wiring 592.

Each terminal portion 342 is exposed from the resin member 2. Each terminal portion 342 is bent upward in the thickness direction z. Each terminal portion 342 is an external terminal of the semiconductor device A3. Each terminal portion 342 is an input terminal for various control signals to the drive circuit DR, an output terminal for control signals from the drive circuit DR, or an input terminal for the operating power for the drive circuit DR.

The fifth leads 35 are supported by the resin member 2 and also supported by the insulating substrate 50. Each fifth lead 35 electrically conducts to a thermistor 8a. In the present embodiment, two fifth leads 35 are provided for each of the two thermistors 8a. That is, the semiconductor device A3 includes four fifth leads 35. As shown in FIG. 16, each of the fifth leads 35 includes a pad portion 351 and a terminal portion 352. In each fifth lead 35, the pad portion 351 and the terminal portion 352 electrically conduct to each other.

Each pad portion 351 is covered with the resin member 2. Each pad portion 351 is disposed on the substrate obverse surface 50a of the insulating substrate 50 and overlaps with the insulating substrate 50 in plan view. Each pad portion 351 is bonded to a relevant one of the pad portions 591 with a conductive bonding material not shown. Each pad portion 591 to which a pad portion 351 is bonded electrically conducts to one of the two thermistors 8a via a connection wiring 592. Thus, each pad portion 351 electrically conducts to one of the thermistors 8a via the wiring portion 59.

Each terminal portion 352 is exposed from the resin member 2. Each terminal portion 352 is bent upward in the thickness direction z. The terminal portions 352 overlap with the terminal portions 342 as viewed in the first direction x. Each terminal portion 352 is an external terminal of the semiconductor device A3. Each terminal portion 352 is a temperature detection terminal.

Each of the first connecting members 41A is bonded to the second electrode 112 of the first switching element 11A, the fifth electrode 122 of the second switching element 12A, and the pad portion 321 of the second lead 32A. The second electrode 112 (emitter) of the first switching element 11A and the fifth electrode 122 (source) of the second switching element 12A electrically conduct to each other via the first connecting members 41A.

Each of the first connecting members 41B is bonded to the second electrode 112 of the first switching element 11B, the fifth electrode 122 of the second switching element 12B, and the pad portion 321 of the second lead 32B. The second electrode 112 (emitter) of the first switching element 11B and the fifth electrode 122 (source) of the second switching element 12B electrically conduct to each other via the first connecting members 41B.

The second connecting member 421A is bonded to the third electrode 113 of the first switching element 11A and one of the pad portions 591. The second connecting member 422A is bonded to the sixth electrode 123 of the second switching element 12A and the pad portion 591 to which the second connecting member 421A is bonded. The pad portion 591 to which the two second connecting members 421A and 422A are bonded electrically conducts to the drive circuit DR (the drive element 13) via a connection wiring 592 and a resistor 8b.

The second connecting member 421B is bonded to the third electrode 113 of the first switching element 11B and one of the pad portions 591. The second connecting member 422B is bonded to the sixth electrode 123 of the second switching element 12B and the pad portion 591 to which the second connecting member 421B is bonded. The pad portion 591 to which the two second connecting members 421B and 422B are bonded electrically conducts to the drive circuit DR (the drive element 13) via a connection wiring 592 and a resistor 8b.

In the semiconductor device A3, the first switching circuit 1A is configured in the same manner as the switching circuit 1 of the semiconductor device A1. Therefore, the semiconductor device A3 can reduce the power loss in the first switching circuit 1A. Moreover, even in the case where the first switching element 11A and the second switching element 12A are operated by a common first drive signal, the semiconductor device A3 can suppress the oscillations of the first drive signal. That is, the semiconductor device A3 can eliminate the malfunctions of the first switching element 11A and the second switching element 12A. This holds for the second switching circuit 1B. That is, the semiconductor device A3 can reduce the power loss in the second switching circuit 1B. Moreover, even in the case where the first switching element 11B and the second switching element 12B are operated by a common second drive signal, the semiconductor device A3 can suppress the oscillations of the second drive signal. That is, the semiconductor device A3 can eliminate the malfunctions of the first switching element 11B and the second switching element 12B.

The third embodiment shows the example in which the semiconductor device A3 includes one each of the first switching circuit 1A and the second switching circuit 1B. In an example different from this, the semiconductor device may include three each of the first switching circuit 1A and the second switching circuit 1B. Such a semiconductor device is configured, for example, as a three-phase inverter that drives a three-phase motor.

The semiconductor device according to the present disclosure is not limited to the embodiments described above. The specific configuration of each part of a semiconductor device according to the present disclosure may suitably be designed and changed in various manners. The present disclosure includes the embodiments described in the following clauses.

Clause 1.

A semiconductor device comprising:
a switching circuit that switches between a conducting state and a disconnected state, wherein
the switching circuit includes a first switching element and a second switching element that are electrically connected in parallel,
the first switching element is an IGBT,
the second switching element is a MOSFET,
when a current flowing in the switching circuit is less than a first current value, the second switching element has a lower voltage than the first switching element,
when current flowing in the switching circuit is equal to or greater than a second current value and equal to or less than a third current value, a threshold voltage of the second switching element is in a range from −1.0 V to +0.4 V, inclusive, relative to a threshold voltage of the first switching element,
the third current value is equal to or less than a rated current of the switching circuit, and
the first current value is less than the third current value.

Clause 2.

The semiconductor device according to clause 1, wherein the first switching element comprises a first semiconductor material, and the second switching element comprises a second semiconductor material having a wider bandgap than the first semiconductor material.

Clause 3.

The semiconductor device according to clause 2, wherein the first semiconductor material is Si, and
the second semiconductor material is SiC.

Clause 4.

The semiconductor device according to any one of clauses 1 to 3, wherein the first current value is ⅕ of the rated current.

Clause 5.

The semiconductor device according to any one of clauses 1 to 4, wherein the second current value is equal to the first current value.

Clause 6.

The semiconductor device according to clause 5, wherein the second current value is ⅕ of the rated current, and
the third current value is ⅗ of the rated current.

Clause 7.

The semiconductor device according to any one of clauses 1 to 6, wherein when the switching circuit is in the conducting state, the current flowing in the switching circuit is equal to or greater than the first current value.

Clause 8.

The semiconductor device according to any one of clauses 1 to 7, wherein switching operations of the first switching element and the second switching element are controlled by a common drive signal.

Clause 9.

The semiconductor device according to clause 8, wherein the first switching element includes a first electrode, a second electrode and a third electrode, ON/OFF control between the first electrode and the second electrode being performed by the drive signal inputted to the third electrode,
the second switching element includes a fourth electrode, a fifth electrode and a sixth electrode, ON/OFF control between the fourth electrode and the fifth electrode being performed by the drive signal inputted to the sixth electrode,
the first electrode and the fourth electrode are electrically connected to each other, and
the second electrode and the fifth electrode are electrically connected to each other.

Clause 10.

The semiconductor device according to clause 9, further comprising a drive circuit that inputs the drive signal to each of the third electrode and the sixth electrode.

Clause 11.

The semiconductor device according to clause 9 or 10, wherein the first switching element includes a first element obverse surface and a first element reverse surface spaced apart from each other in a thickness direction of the first switching element,
the first electrode is disposed on the first element reverse surface, and
the second electrode and the third electrode are disposed on the first element obverse surface.

Clause 12.

The semiconductor device according to clause 11, wherein the second switching element includes a second element obverse surface and a second element reverse surface spaced apart from each other in a thickness direction of the second switching element,
the fourth electrode is disposed on the second element obverse surface, and
the fifth electrode and the sixth electrode are disposed on the second element reverse surface.

Clause 13.

The semiconductor device according to clause 12, wherein the thickness direction of the first switching element and the thickness direction of the second switching element are a same direction, and
the first element obverse surface and the second element obverse surface face in a same direction.

Clause 14.

The semiconductor device according to clause 13, further comprising:
a first conductor on which the first switching element and the second switching element are mounted and which faces each of the first element reverse surface and the second element reverse surface, and
a second conductor spaced apart from the first conductor, wherein
the first electrode and the fourth electrode are bonded to the first conductor, and
the second conductor is electrically connected to the second electrode and the fifth electrode.

Clause 15.

The semiconductor device according to any one of clauses 1 to 14, wherein the switching circuit includes a first switching circuit and a second switching circuit, and
each of the first switching circuit and the second switching circuit includes the first switching element and the second switching element.

Clause 16.

The semiconductor device according to clause 15, wherein the first switching circuit and the second switching circuit are electrically connected in series.

REFERENCE NUMERALS

A1, A2, A3: Semiconductor device
1: Switching circuit
1A: First switching circuit
1B: Second switching circuit
11, 11A, 11B: First switching element
11a: First element obverse surface
11b: First element reverse surface
111: First electrode
112: Second electrode
113: Third electrode
12, 12A, 12B: Second switching element
12a: Second element obverse surface
12b: Second element reverse surface
121: Fourth electrode
122: Fifth electrode
123: Sixth electrode
13: Drive element
2: Resin member
21: Resin obverse surface
22: Resin reverse surface
23: First resin side surface
24: Second resin side surface
3: Lead
31, 31A, 31B: First lead
311: Die pad
312: Extension
313: Protruding portion
314: Terminal portion
32, 32A, 32B: Second lead
321: Pad portion
322: Terminal portion 33: Third lead
331: Pad portion
332: Terminal portion
34: Fourth lead
341: Pad portion
342: Terminal portion
35: Fifth lead
351: Pad portion
352: Terminal portion
4: Connecting member
411, 412: First connecting member
411A, 411B, 412A, 412B: First connecting member
41A, 41B: First connecting member
421, 422: Second connecting member
421A, 421B, 422A, 422B: Second connecting member
431A, 431B, 432A, 432B: Third connecting member
44A, 44B: Fourth connecting member
45A, 45B: Fifth connecting member
46: Sixth connecting member
50: Insulating substrate
50a: Substrate obverse surface
50b: Substrate reverse surface
51: First power wiring portion
52: Second power wiring portion
53: Third power wiring portion
54A, 54B: First signal wiring portion
55B: Second signal wiring portion
56: Third signal wiring portion
59: Wiring portion
591: Pad portion
592: Connection wiring
61: First power terminal
62: Second power terminal
63: Third power terminal
64A, 64B: Control terminal
65A, 65B: Detection terminal
66: Detection terminal
67: Detection terminal
70: Heat dissipation plate
71: Case
72: Frame
73: Top plate
741-744: Terminal block
8: Passive element
8a: Thermistor
8b: Resistor DR: Drive circuit

The invention claimed is:

1. A semiconductor device comprising:
a switching circuit that switches between a conducting state and a disconnected state, wherein
the switching circuit includes a first switching element and a second switching element that are electrically connected in parallel,
the first switching element is an IGBT,
the second switching element is a MOSFET,
when a current flowing in the switching circuit is less than a first current value, the second switching element has a lower voltage than the first switching element,
when current flowing in the switching circuit is equal to or greater than a second current value and equal to or less than a third current value, a threshold voltage of the second switching element is in a range from −1.0 V to +0.4 V, inclusive, relative to a threshold voltage of the first switching element,
the third current value is equal to or less than a rated current of the switching circuit, and
the first current value is less than the third current value.

2. The semiconductor device according to claim 1, wherein the first switching element comprises a first semiconductor material, and
the second switching element comprises a second semiconductor material having a wider bandgap than the first semiconductor material.

3. The semiconductor device according to claim 2, wherein the first semiconductor material is Si, and
the second semiconductor material is SiC.

4. The semiconductor device according to claim 1, wherein the first current value is ⅕ of the rated current.

5. The semiconductor device according to claim 1, wherein the second current value is equal to the first current value.

6. The semiconductor device according to claim 5, wherein the second current value is ⅕ of the rated current, and
the third current value is ⅗ of the rated current.

7. The semiconductor device according to claim 1, wherein when the switching circuit is in the conducting state, the current flowing in the switching circuit is equal to or greater than the first current value.

8. The semiconductor device according to claim 1, wherein switching operations of the first switching element and the second switching element are controlled by a common drive signal.

9. The semiconductor device according to claim 8, wherein the first switching element includes a first electrode, a second electrode and a third electrode, ON/OFF control between the first electrode and the second electrode being performed by the drive signal inputted to the third electrode,
the second switching element includes a fourth electrode, a fifth electrode and a sixth electrode, ON/OFF control between the fourth electrode and the fifth electrode being performed by the drive signal inputted to the sixth electrode,
the first electrode and the fourth electrode are electrically connected to each other, and
the second electrode and the fifth electrode are electrically connected to each other.

10. The semiconductor device according to claim 9, further comprising a drive circuit that inputs the drive signal to each of the third electrode and the sixth electrode.

11. The semiconductor device according to claim 9, wherein the first switching element includes a first element obverse surface and a first element reverse surface spaced apart from each other in a thickness direction of the first switching element,
the first electrode is disposed on the first element reverse surface, and
the second electrode and the third electrode are disposed on the first element obverse surface.

12. The semiconductor device according to claim 11, wherein the second switching element includes a second element obverse surface and a second element reverse surface spaced apart from each other in a thickness direction of the second switching element,
the fourth electrode is disposed on the second element obverse surface, and
the fifth electrode and the sixth electrode are disposed on the second element reverse surface.

13. The semiconductor device according to claim 12, wherein the thickness direction of the first switching element and the thickness direction of the second switching element are a same direction, and
the first element obverse surface and the second element obverse surface face in a same direction.

14. The semiconductor device according to claim 13, further comprising:
- a first conductor on which the first switching element and the second switching element are mounted and which faces each of the first element reverse surface and the second element reverse surface, and
- a second conductor spaced apart from the first conductor, wherein
- the first electrode and the fourth electrode are bonded to the first conductor, and
- the second conductor is electrically connected to the second electrode and the fifth electrode.

15. The semiconductor device according to claim 1, wherein the switching circuit includes a first switching circuit and a second switching circuit, and
- each of the first switching circuit and the second switching circuit includes the first switching element and the second switching element.

16. The semiconductor device according to claim 15, wherein the first switching circuit and the second switching circuit are electrically connected in series.

* * * * *